US010334721B2

(12) United States Patent
Ikeda

(10) Patent No.: US 10,334,721 B2
(45) Date of Patent: Jun. 25, 2019

(54) ELECTRONIC COMPONENT AND ELECTRONIC COMPONENT MANUFACTURING METHOD

(71) Applicant: NEC Corporation, Minato-ku, Tokyo (JP)

(72) Inventor: Hironobu Ikeda, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 15/867,904

(22) Filed: Jan. 11, 2018

(65) Prior Publication Data
US 2018/0220528 A1    Aug. 2, 2018

(30) Foreign Application Priority Data

Feb. 1, 2017 (JP) .................. 2017-016465

(51) Int. Cl.
H05K 1/02      (2006.01)
H05K 1/05      (2006.01)
H01L 23/00     (2006.01)
H01L 23/498    (2006.01)
H01L 23/538    (2006.01)

(52) U.S. Cl.
CPC ...... *H05K 1/0271* (2013.01); *H01L 23/49811* (2013.01); *H01L 23/5383* (2013.01); *H01L 23/562* (2013.01); *H05K 1/05* (2013.01); *H01L 2224/16225* (2013.01); *H01L 2924/15311* (2013.01); *H01L 2924/3511* (2013.01)

(58) Field of Classification Search
CPC ..... H05K 1/181; H01L 51/56; H01L 51/5056; H01L 2251/308; H01L 27/3211

USPC ....................................... 257/774
See application file for complete search history.

(56) References Cited

U.S. PATENT DOCUMENTS 5,306,670 A     4/1994  Mowatt et al.
2016/0372448 A1 12/2016 Yazdani

FOREIGN PATENT DOCUMENTS

JP   51-130449 U   10/1976
JP   H06-350020 A  12/1994
JP   H08-124967 A   5/1996
JP   H11-251483 A   9/1999
JP   2016-213361 A 12/2016

OTHER PUBLICATIONS

English machine translation of Japanese Unexamined Patent Application No. H06-350020 (Original Document Submitted on Jan. 11, 2018).
English machine translation of Japanese Unexamined Patent Application No. H08-124967 (Original Document Submitted on Jan. 11, 2018).
English machine translation of Japanese Unexamined Patent Application No. H11-251483 (Original Document Submitted on Jan. 11, 2018).
Japanese Office Action for JP Application No. 2017-016465 dated Dec. 22, 2017 with partial English Translation.

*Primary Examiner* — Andy Huynh

(57) ABSTRACT

An electronic component includes: a first substrate that comprises a first substrate surface; a second substrate that is arranged on the first substrate; and a connecting member that connects the first substrate and a peripheral edge portion of the second substrate. The second substrate is fixed to the first substrate by the connecting member.

12 Claims, 12 Drawing Sheets

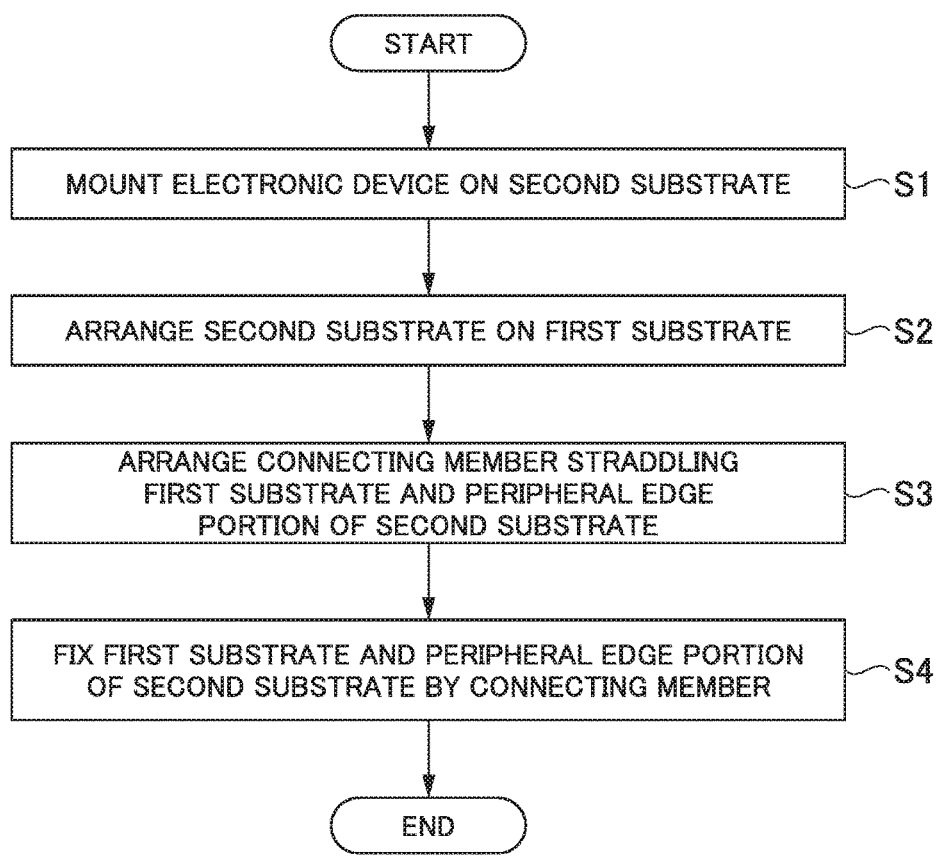

ELECTRONIC COMPONENT AND ELECTRONIC COMPONENT MANUFACTURING METHOD

This application is based upon and claims the benefit of priority from Japanese patent application No. 2017-016465, filed on Feb. 1, 2017, the disclosure of which is incorporated herein in its entirety by reference.

BACKGROUND OF THE INVENTION

Field of the Invention

The present invention relates to an electronic component and an electronic component manufacturing method.

Description of Related Art

Among electronic component manufacturing methods, it is known to electrically connect a component substrate on which element components are mounted in advance to a wiring substrate on which circuits are formed by for example soldering. In this case, the component substrate receives a thermal load during mounting of the element components.

In relation to such an electronic component and electronic component manufacturing method, for example Japanese Unexamined Patent Application No. H6-350020 (hereinbelow Patent Document 1), Japanese Unexamined Patent Application No. H8-124967 (hereinbelow Patent Document 2), and Japanese Unexamined Patent Application No. H11-251483 (hereinbelow Patent Document 3) disclose various electronic components in which a component substrate is connected to a wiring substrate.

The component substrate and the element component have different thermal expansion coefficients due to differences in respective materials thereof. For this reason, when mutually joined in a state of having received a thermal load, due to the bimetal effect arising from a difference in shrinkage rates after the completion of the joining process, warpage occurs in the component substrate.

There is a risk that a component substrate in which warpage has occurred cannot be joined with a wiring substrate due to the extent of the warpage.

Variations arise in the opposing distance between joining electrodes of the component substrate in which warpage has arisen and joining electrodes in the wiring substrate. For that reason, even when the component substrate in which warpage has arisen and the wiring substrate can be joined together, at the regions where the opposing distance is great, there is a risk of the joining strength at the joints decreasing. Moreover, in a component substrate in which warpage has occurred, the warpage state easily changes due to heat generation during use or the thermal environment. As a result, since the joints between the component substrate and the wiring substrate receive repeated thermal stress, there is risk of a drop in the reliability of the electrical connection.

In the electronic components disclosed in Patent Documents 1 to 3, since the component substrate is directly connected with the wiring substrate, constitutions capable of solving these problems are not disclosed. An exemplary object of the present invention is to provide an electronic component and an electronic component manufacturing method capable of solving one of the aforementioned issues.

SUMMARY OF THE INVENTION

An electronic component according to an exemplary aspect of the present invention includes: a first substrate that comprises a first substrate surface; a second substrate that is arranged on the first substrate; and a connecting member that connects the first substrate and a peripheral edge portion of the second substrate. The second substrate is fixed to the first substrate by the connecting member.

An electronic component manufacturing method according to an exemplary aspect of the present invention includes: arranging a second substrate on a first substrate; arranging a connecting member in a state of straddling the first substrate and the peripheral edge portion of the second substrate; and fixing the first substrate and the peripheral edge portion of the second substrate by the connecting member.

According to an electronic component of an exemplary embodiment of the present invention and an electronic component manufacturing method of an exemplary embodiment of the present invention, manufacturing is easy and reliability is favorable even for an electronic component including substrates having different thermal expansion coefficients.

BRIEF DESCRIPTION OF THE DRAWINGS

FIG. 8 is a flowchart showing an example of the manufacturing method of the electronic component of the second exemplary embodiment of the present invention.

EXEMPLARY EMBODIMENT

Figure 1:
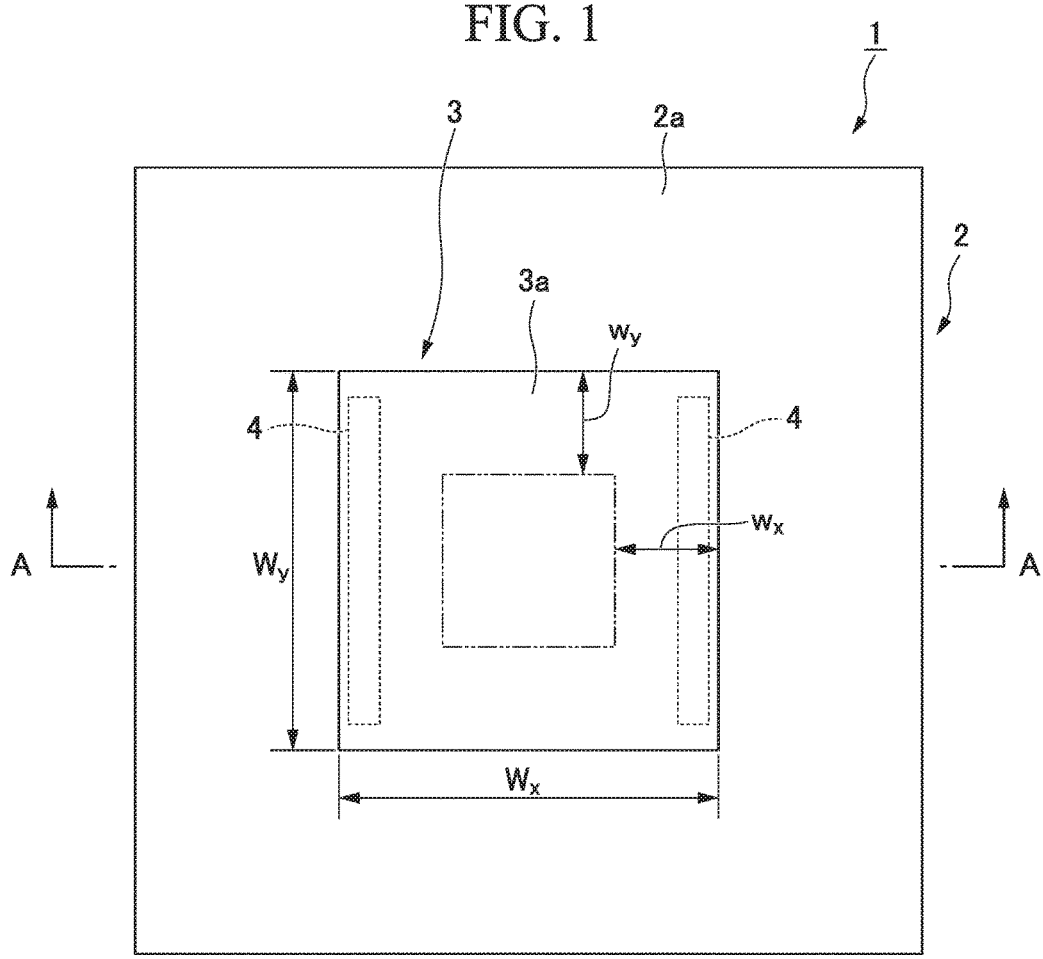
FIG. 1 is a schematic plan view that shows an example of the electronic component of the first exemplary embodiment of the present invention.

Hereinbelow, exemplary embodiments of the present invention are described with reference to the appended drawings. In all the drawings, even if the exemplary embodiment differs, the same or corresponding members are denoted by the same reference numerals, and hence common description is omitted.

First Exemplary Embodiment

The electronic component according to the first exemplary embodiment of the present invention will be described.

Figure 2:
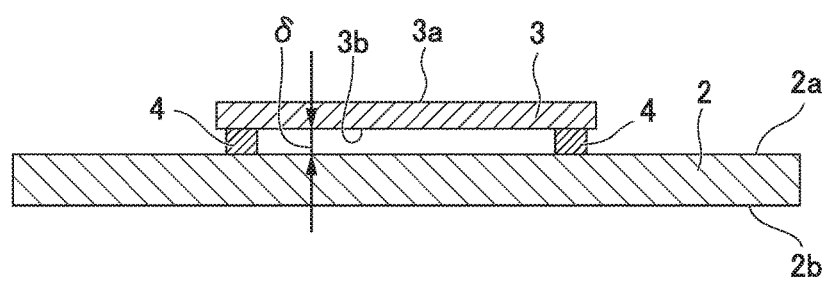
FIG. 2 is a cross-sectional view along A-A in FIG. 1.

FIG. 1 is a schematic plan view that shows an example of the electronic component of the first exemplary embodiment of the present invention. FIG. 2 is a cross-sectional view along A-A in FIG. 1.

As the figures are schematics, the shapes and dimensions therein are exaggerated (with the same being true for the subsequent figures).

As shown in FIG. 1, an electronic component 1 of the present exemplary embodiment includes a first substrate 2, a second substrate 3, and connecting members 4.

The first substrate 2 is the main substrate in the electronic component 1. Various electronic devices (not illustrated) may be mounted on the substrate surfaces 2a, 2b of the first substrate 2.

The first substrate 2 may for example be constituted by an electronic circuit board such as a printed wiring board (PWB). The shape of the first substrate 2 is not particularly limited. In the electronic component 1 illustrated in FIG. 1, the first substrate 2 has a rectangular shape in a plan view.

The second substrate 3 is a modular substrate in the electronic component 1. The second substrate 3 may be constituted with a plurality of large scale integration (LSI) devices (not illustrated) mounted thereon.

The second substrate 3 may be constituted with an electronic circuit substrate such as a PWB similarly to the first substrate 2. However, the second substrate 3 may also be constituted with a material having a thermal expansion coefficient different from the thermal expansion coefficient of the first substrate 2. For example, when a plurality of LSI devices are densely mounted on the second substrate 3, the temperature of the second substrate 3 is liable to become very high due to the heat generation of the LSI devices. Since the thermal expansion coefficient of an LSI device is generally less than a circuit substrate such as a PWB, the second substrate 3 may be constituted with a material having a lower thermal expansion coefficient than the first substrate 2.

Moreover, in the case of LSI devices being mounted on the second substrate 3, for example an interposer substrate on which the LSI devices are mounted may be mounted on the second substrate 3 with a ball grid array (BGA). In this case, the LSI devices may be BGA-joined to the interposer substrate. Examples of the interposer substrate include a silicon interposer substrate and an organic system interposer substrate. When an organic interposer substrate is used, it is more preferable that a low thermal expansion-type organic interposer substrate be used in which the thermal expansion coefficient is lower than the thermal expansion coefficient of the second substrate 3.

The rectangular shape in plan view of the second substrate 3 is not particularly limited. In the electronic component 1 shown in FIG. 1, as one example the second substrate 3 has a rectangular shape in plan view.

The connecting member 4 connects the first substrate 2 and at least a portion of the peripheral edge portion of the second substrate 3. Here, "peripheral edge portion" of the second substrate 3 is, in the substrate surfaces $3a$ and $3b$ of the second substrate 3, a band-shaped region in which the distance from the exterior shape in plan view is 25% or less of the exterior shape width of the second substrate 3. For example, as illustrated in FIG. 1, when the exterior shape of the second substrate 3 is a rectangular shape of widths $W_x \times W_y$, the width $w_y$ of the peripheral edge portion along the side of width $W_x$ is equal to or less than $0.25 \times W_y$. Similarly, the width $w_x$ of the peripheral edge portion along the side of width $W_y$ is equal to or less than $0.25 \times W_x$. It is more preferable that the peripheral edge portion be a narrow width. For example, when the width $w_x$ (or $w_y$) of the peripheral edge portion is expressed in the form of $\alpha \times W_x$ (or $\alpha \times W_y$), $\alpha$ may be 0.2 or less, 0.15 or less, 0.1 or less, or 0.01 or less.

In the substrate surfaces $3a$ and $3b$, the region to the inside of the aforementioned peripheral edge portions is called the "center portion."

It is more preferred that the connecting members 4 be provided only in the peripheral edge portions and not be provided in the center portion.

The arrangement position of the connecting member 4 at the peripheral edge portion is not particularly limited. In the example shown in FIG. 1, the connecting member 4 is arranged at the peripheral edge portions of the second substrate 3 in the horizontal direction of the figure. In the example shown in FIG. 1, the connecting member 4 is not provided at the peripheral edge portions of the second substrate 3 in the vertical direction of the figure.

However, the connecting member 4 may also be provided in a closed curve shape going around within the peripheral edge portions, following the exterior shape of the second substrate 3.

In FIG. 1, each connecting member 4 is provided in a single-row linear shape extending in the vertical direction of the figure.

However, each connecting member 4 may consist of a plurality of portions. In this case, each connecting member 4 may be comprised of a plurality of adjacent portions in at least one of the short dimension direction and long dimension direction over the range of the peripheral edge portion.

In the case of the connecting member 4 consisting of a plurality, the plurality of connecting members 4 may also be formed in a plurality of dot shapes that are mutually separated in plan view.

When connecting the first substrate 2 and the second substrate 3 with the connecting member 4, an appropriate member capable of fixing the second substrate 3 to the first substrate 2 is used. It is more preferred that the material of the connecting member 4 be deformable in response to for example thermal stress that arises due to the difference in the thermal expansion coefficients of the first substrate 2 and the second substrate 3.

The connecting member 4 mechanically connects the first substrate 2 and the second substrate 3. The connecting member 4 may additionally connect the first substrate 2 and the second substrate 3 electrically.

As the material of the connecting member 4, for example solder, an electrically conductive adhesive agent, or the like may be used. When the connecting member 4 is not to connect the first substrate 2 and second substrate 3 electrically, a non-electrically conductive adhesive agent may be used as the connecting member 4.

As shown in FIG. 2, in the electronic component 1 of the present exemplary embodiment, the second substrate 3 is arranged above the substrate surface 2a of the first substrate 2 in a manner approximately parallel with the first substrate 2 (including the case of being parallel). For this reason, the substrate surface 3b of the second substrate 3 faces the substrate surface 2a.

The connecting members 4 are arranged between the peripheral edge portion of the substrate surface 3b and the opposing substrate surface 2a. Each connecting member 4 is fixed to substrate surfaces 2a and 3b, respectively.

With such a configuration, the substrate surfaces 2a and 3b are mutually opposed with a gap δ therebetween (δ>0).

The operation of the electronic component 1 having such a configuration will be described.

Figure 3A:
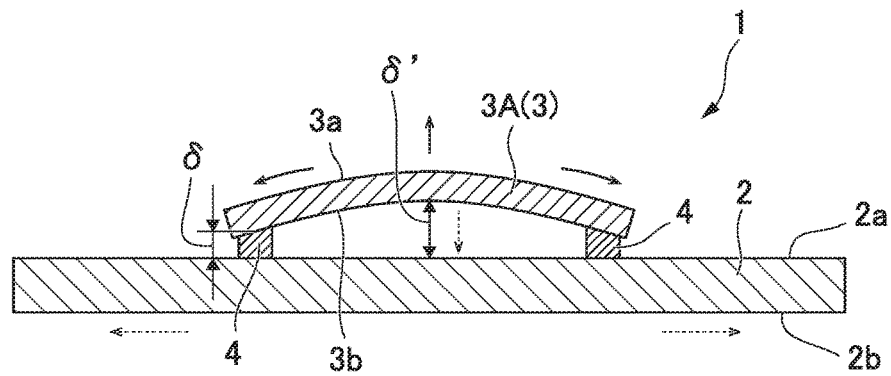
FIG. 3A is a schematic view for describing the operation of the electronic component of the first exemplary embodiment of the present invention.
Figure 3B:
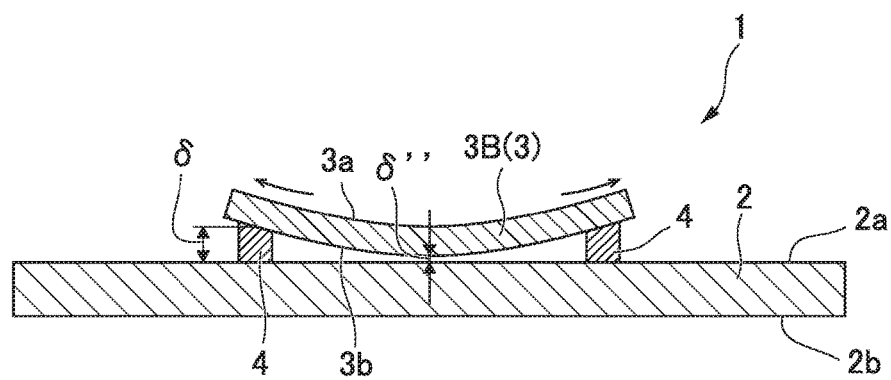
FIG. 3B is a schematic view for describing the operation of the electronic component of the first exemplary embodiment of the present invention.
Figure 3C:
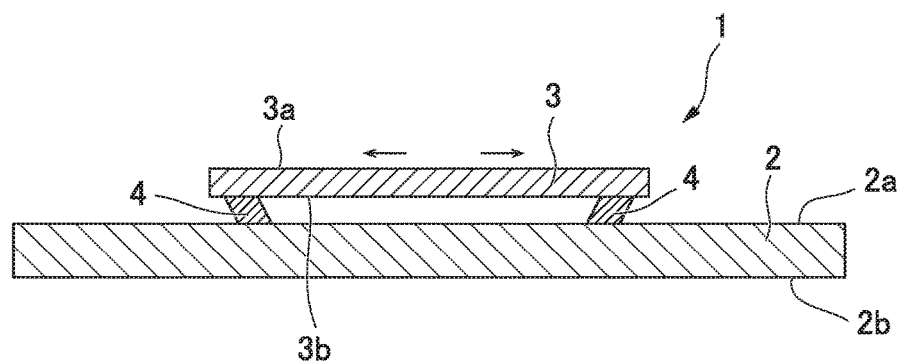
FIG. 3C is a schematic view for describing the operation of the electronic component of the first exemplary embodiment of the present invention.

FIGS. 3A to 3C are schematic views for describing the operation of the electronic component of the first exemplary embodiment of the present invention.

When for example an electronic device, such as an LSI, is mounted on the second substrate 3, solder joining is often used for mounting of the electronic device. During solder joining, the second substrate 3 is exposed to a high temperature that is equal to or greater than the melting point of the solder in the mounting process. As a result, after the electronic device is mounted and the second substrate 3 returns to a normal temperature, there is a risk of warpage occurring in the second substrate 3 due to the difference in the thermal expansion coefficients of the electronic device and the second substrate 3.

For example, when the thermal expansion coefficient of the second substrate 3 is greater than the thermal expansion coefficient of the electronic device, at a normal temperature, convex warpage occurs in the substrate surface 3a that is the component mounting surface, in the manner of the second substrate 3A shown in FIG. 3A.

For example, when a CPU and memory having many connection terminals are to be mounted on the second substrate 3 as LSI devices, these LSI devices are BGA connected to a silicon interposer substrate, with the silicon interposer substrate and the second substrate 3 often being BGA connected. The thermal expansion coefficient of the silicon interposer substrate is about $3 \times 10^{-6}$ (1/T). In contrast, in the case of a PWB that includes an organic substrate which can be used for the second substrate 3, the thermal expansion coefficient is about $16 \times 10^{-6}$ (1/T). For this reason, when the silicon interposer substrate is BGA connected to the organic substrate, a junction structure is formed in the state of the organic substrate having undergone thermal expansion. As a result, upon returning to a normal temperature environment after the BGA connection, due to the organic substrate shrinking by a relatively greater extent, for example convex warpage occurs in the substrate surface 3a on the silicon interposer substrate side in the manner of the second substrate 3A.

In the case of an LSI device being joined to the second substrate 3 by being BGA connected to an organic interposer substrate, when the thermal expansion coefficient of the organic interposer substrate is less than the PWB, the same phenomenon arises.

In this way, when convex warpage arises in the substrate surface 3a, the substrate surface 3b becomes a concave surface. For this reason, in the event of fixing the second substrate 3A to the first substrate 2, the gap between the substrate surface 2a and the substrate surface 3b becomes greater in the center portion compared to the peripheral edge portion. However, in the present exemplary embodiment, the connecting members 4 are connected only at the peripheral edge portions of the second substrate 3A. For this reason, even when warpage is present as in the second substrate 3A, the second substrate 3A remains fixed to the first substrate 2 via the connecting member 4 without a connection failure occurring.

Moreover, in such a fixed state, a gap of δ' (δ'>δ) is formed at the center portion of the substrate surface 3b with respect to the substrate surface 2a. Only the peripheral edge portions of the second substrate 3A are constrained by the connecting member 4. As a result, in the event of the second substrate 3A undergoing thermal expansion due to heat generation of an electronic device after the fixing of the second substrate 3A, the second substrate 3A more easily deforms than when the center portion is constrained (refer to the solid arrows in FIG. 3A). In that event, the warpage of the second substrate 3A changes such that the gap δ' increases in the center portion of the substrate surface 3b. For this reason, there is no inhibiting of the deformation due to the second substrate 3A and the first substrate 2 making contact at the center portion.

In this way, in the present exemplary embodiment, since the thermal expansion of the second substrate 3A is absorbed to some extent by the deformation of the second substrate 3A, stress loading on the connecting members 4 and the first substrate 2 is reduced. As a result, there is less of a tendency for warpage of the entire electronic component 1 to occur. Moreover, since the stress that arises in the connecting members 4 can be reduced, breakage or the like to the connecting members 4 is prevented.

When the environment temperature of the electronic component 1 rises, expansion of the first substrate 2 often increases due to the difference between the thermal expansion coefficient of the second substrate 3A and the thermal expansion coefficient of the first substrate 2. In this case, since the center portion of the second substrate 3A is not constrained, there is a margin to deform in the direction in which the warpage decreases in the space with the first substrate 2. For this reason, by the second substrate 3 also deforming along with the thermal expansion of the first substrate 2, the thermal expansion of the first substrate 2 is hardly impeded (refer to the dashed line arrows in FIG. 3A). As a result, warping of the entire electronic device 1 has less of a tendency to occur.

Moreover, since the stress that occurs in the connecting member 4 can be reduced, breakage of the connecting members 4 is prevented.

Moreover, in the case of the connecting members 4 being constituted by a material that is deformable by thermal stress generated by the thermal expansion of the second substrate 3A or first substrate 2, the thermal stress is absorbed by the deformation of the connecting members 4 themselves, in addition to the aforementioned deformation of the second substrate 3A.

For this reason, since the stress load at the connection portions between the connecting members 4, and the second substrate 3A and first substrate 2 is reduced, the reliability of the connection at the connecting members 4 improves.

Due to component variations in the flatness of the second substrate 2, it is also conceivable for concave warpage to occur in the substrate surface 3a, as in the second substrate 3B shown for example in FIG. 3B. In this case, it is possible to ensure the gap δ" with the substrate surface 2a at the center portion of the substrate surface 3b by making the height δ of the connecting members 4 greater than the expected warpage amount (0<δ"<δ).

In this case since the second substrate 3B is not constrained at the center portion of the substrate surface 3b similarly to the second substrate 3A, even if thermal deformation occurs in the second substrate 3B or the first substrate 2, provided it is deformation within the range of the gap δ", warping of the entire electronic device 1 has less of a tendency to occur. Moreover, since the stress that occurs in the connecting member 4 can be reduced, breakage of the connecting member 4 is prevented.

In the present exemplary embodiment, since the connecting members 4 are arranged at the peripheral edge portions of the second substrate 3, the cross-sectional area of the connecting members 4 in a section passing through the center of the second substrate 3 is small compared with the cross-sectional area of the second substrate 3.

For that reason, as shown in FIG. 3C, the connecting members 4 easily undergo shear deformation by the thermal expansion of the second substrate 3. When the connecting members 4 undergo shear deformation, the connecting members 4 can absorb the thermal stress caused by the thermal expansion of the second substrate 3. For this reason, deformation of the first substrate 2 is inhibited.

The operation of the electronic component 1 of the present exemplary embodiment described above will now be described contrasted with a comparative example.

Figure 4A:
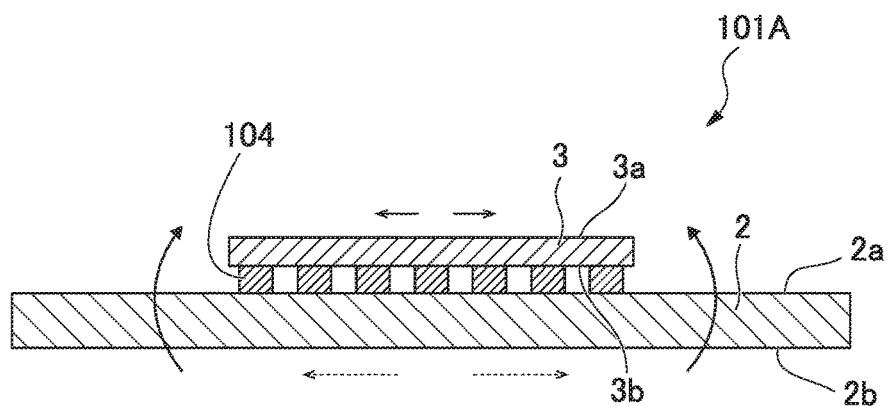
FIG. 4A is a schematic view for describing the operation of an electronic component of a comparative example.
Figure 4B:
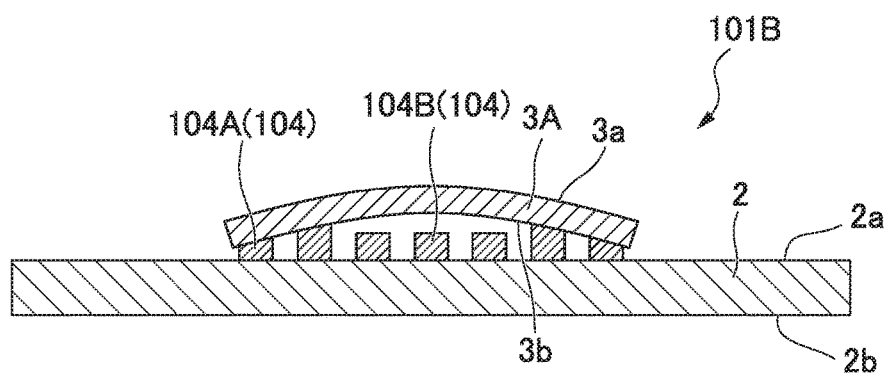
FIG. 4B is a schematic view for describing the operation of an electronic component of another comparative example.

FIGS. 4A and 4B are schematic views respectively describing the operations of an electronic component of a comparative example.

FIG. 4A shows an electronic component 101A of a first comparative example. This comparative example is provided with a connecting member 104 instead of the connecting member 4 of the aforementioned first exemplary embodiment.

The connecting member 104 has the same constitution as the connecting member 4. However, a plurality of connecting member 104 are arranged with a narrower pitch across the peripheral edge portions and center portion of the substrate surface 3b.

With such a constitution, in the second substrate 3 of the electronic component 101A, approximately the entire surface of the substrate surface 3b is connected with the first substrate 2 via the connecting members 104. That is, with regard to the second substrate 3 and the first substrate 2, deformation in the direction along the substrate surface 3b and deformation in the direction perpendicular with the substrate surface 3b are constrained via the connecting members 104.

As a result, when at least one of the second substrate 3 and the first substrate 2 undergoes thermal expansion, the bimetal effect arises in accordance with the respective differences in temperatures and thermal expansion coefficients. For this reason, warpage of the entire electronic component 104A easily occurs.

FIG. 4B shows the electronic component 101B of the second comparative example. This comparative example is provided with a second substrate 3A in which warpage occurs at normal temperatures in place of the second substrate 3 in the aforementioned first comparative example.

In such a case, when connecting the second substrate 3A with the first substrate 2 in the manufacturing process, the distance to the substrate surface 3b differs between the connecting members 104A facing the peripheral edge portion of the substrate surface 3b and the connecting members 104B facing the center portion of the substrate surface 3b. In particular, for the connecting members 104B, which are separated from the substrate surface 3b by the distance of the warpage, connection with the substrate surface 3b becomes difficult due to the warpage amount. Even if the connecting members 104B can be connected to the substrate surface 3b, compared to the connecting members 104A, there is a risk of the connection strength decreasing.

To avoid such a problem, for example, the heights of the connecting members 104 must be changed depending on for example the amount of warpage of the second substrate 3A and the arrangement positions of the connecting members 104. For this reason, the electronic component 101B of the second comparative example has the problem of requiring time and effort for manufacture.

Moreover, when the second substrate 3A undergoes repeated thermal expansion during use, the center portion is prone to deform in the direction moving away from the first substrate 2. For this reason, repetition stress resulting from repeated expansion and contraction due to temperature change acts on the connecting members 104B at the center portion.

In this way, even if the connecting members 104B can be fixed during manufacture, the problem arises of reliability over time being prone to decrease due to the operation of repeated stress.

In contrast to this, in the present exemplary embodiment, since the center portion of the second substrate 3 is not constrained by the connecting members 4, the problems of the comparative examples do not arise.

As described above, even if the electronic component 1 of the present exemplary embodiment described above includes substrates having different thermal expansion coefficients, manufacture is easy and reliability is favorable.

Second Exemplary Embodiment

The electronic component according to the second exemplary embodiment of the present invention will be described.

Figure 5:
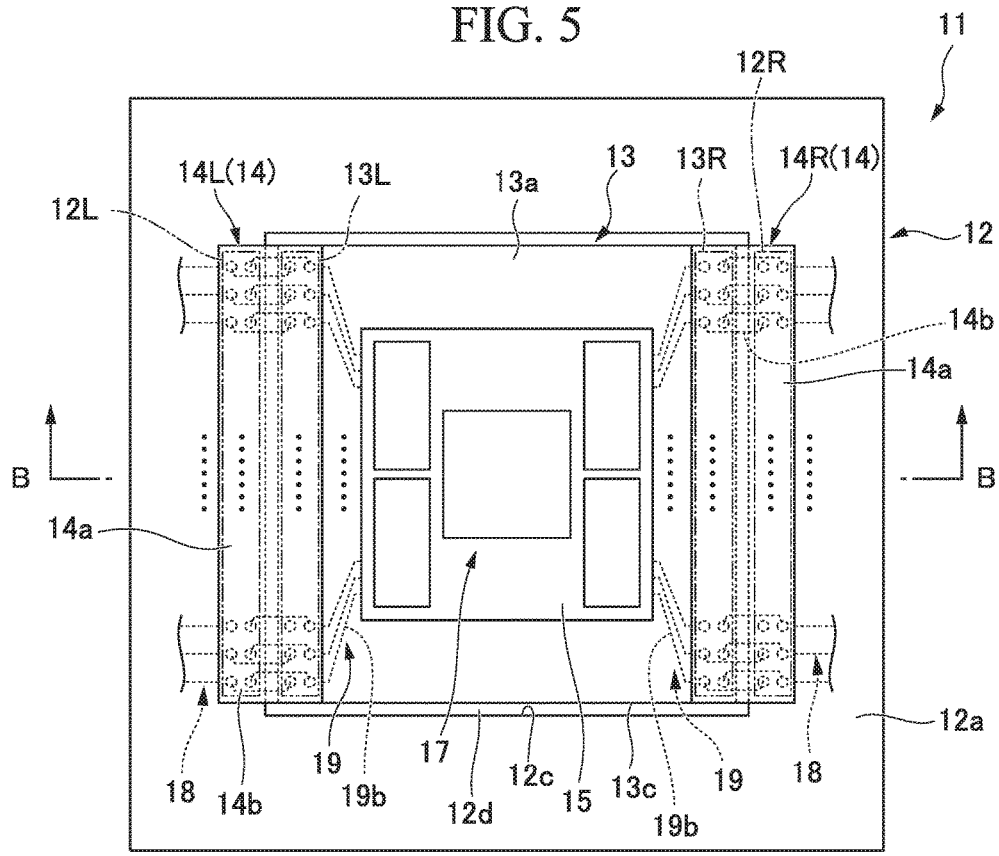
FIG. 5 is a schematic plan view of the electronic component of the second exemplary embodiment of the present invention.
Figure 6:
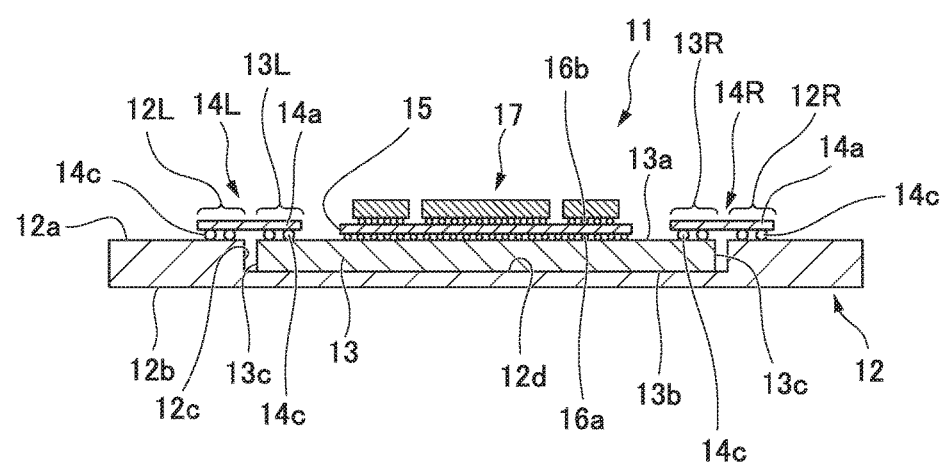
FIG. 6 is a cross-sectional view along B-B in FIG. 5.
Figure 7:
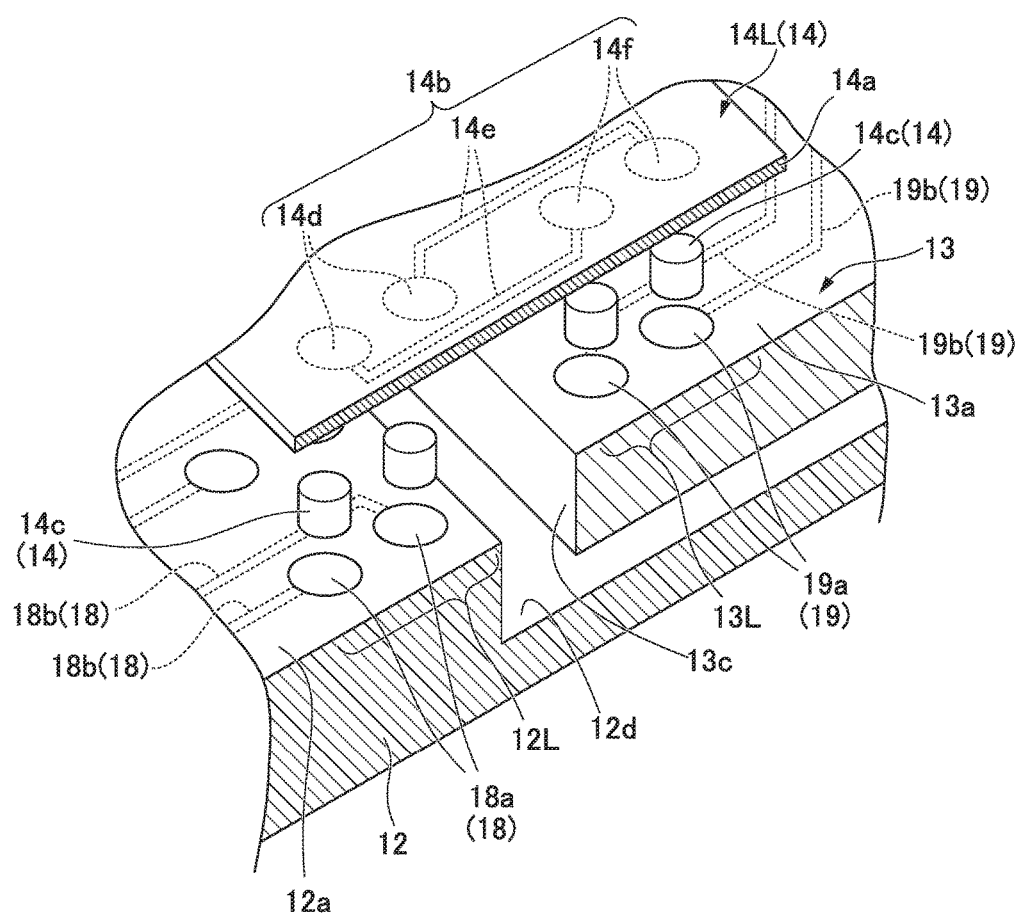
FIG. 7 is a schematic exploded perspective view showing the constitution in the vicinity of the connecting member in the electronic component of the second exemplary embodiment of the present invention.

FIG. 5 is a schematic plan view of the electronic component of the second exemplary embodiment of the present invention. FIG. 6 is a cross-sectional view along B-B in FIG. 5. FIG. 7 is a schematic exploded perspective view showing the constitution in the vicinity of the connecting member in the electronic component of the second exemplary embodiment of the present invention.

As shown in FIG. 5 and FIG. 6, an electronic component 11 of the present exemplary embodiment includes a first substrate 12, a second substrate 13, and a connecting member 14 in place of the first substrate 2, the second substrate 3 and the connecting member 4, respectively, of the electronic component 1 of the first exemplary embodiment.

The description that follows will focus on the points of difference with the first exemplary embodiment given above.

The first substrate 12 is the main substrate in the electronic component 11. Various electronic devices (not illustrated) may be mounted on the substrate surface 12a and substrate surface 12b of the first substrate 12. The substrate surface 12a may be called the first substrate surface.

The first substrate 12 may for example be constituted by a printed wiring board (PWB). The exterior shape in plan view of the first substrate 12 is not particularly limited. In the electronic component 11 illustrated in FIG. 5, the exterior shape in plan view of the first substrate 12 is rectangular. For example, the thickness of the first substrate 12 may be suitably selected as necessary from the standard thicknesses of a PWB.

An opening portion 12c that is rectangular in plan view and that is recessed toward the substrate surface 12b on the opposite side of the substrate surface 12a is formed in the center portion of the substrate surface 12a of the first substrate 12. The opening portion 12c is a bottomed hole that is plugged by a bottom surface portion 12d.

The distance from the substrate surface 12a to the bottom surface portion 12d is not particularly limited, provided it is within the thickness of the first substrate 12. In the electronic component 11 illustrated in FIG. 6, the distance from the substrate surface 12a to the bottom surface portion 12d is approximately equivalent (including the case of being equivalent) to the thickness of the second substrate 13 described below.

As shown in FIG. 5, the rectangular shape in plan view of the opening portion 12c is a shape into which the second substrate 13 described below can be inserted and, in the state of being inserted, a gap is formed between the outer periphery portion 13c of the second substrate 13 and the opening portion 12c in plan view. In plan view, the size of the gap that is formed between the outer periphery portion 13c and the opening portion 12c is such that even if the second substrate 13 undergoes thermal expansion during operation of the electronic component 11, the second substrate 13 does not abut the opening portion 12c.

In the electronic component 11 illustrated in FIG. 5, corresponding to the fact that the second substrate 13 described below has a rectangular shape in plan view, the exterior shape in plan view of the first substrate 12 has a rectangular shape that is larger than the exterior of the second substrate 13.

As shown in FIG. 5, an electrically conductive pattern 18 is formed on the substrate surface 12a side of the first substrate 12. The electrically conductive pattern 18 constitutes the circuit for electrically connecting with a connecting member 14 described below.

In the present exemplary embodiment, the electrically conductive pattern 18 extends in an appropriate direction from the vicinity of the opening portion 12c in the leftward/rightward directions of the figure, in accordance with the arrangement position of the connecting member 14 described below.

In the vicinity of the opening portion 12c in the left and right directions of the figure, a plurality of first electrodes 18a (refer to FIG. 7) are respectively formed in band-shaped regions 12L and 12R extending in the vertical direction in the figure along the opening portion 12c. The first electrode 18a makes an electrical connection between the electrically conductive pattern 18 and the connecting member 14 described below.

As shown in the example of the band-shaped region 12L in FIG. 7, the first electrodes 18a are pad-like electrodes. Each first electrode 18a is provided at the distal end portion of a wire 18b of the electrically conductive pattern 18 extending toward the band-shaped region 12L. The shape in plan view of the first electrode 18a is not particularly limited, provided the shape allows the arrangement of an electrically conductive joining member 14c. The shape in plan view of the first electrode 18a may for example be a circle, a polygon or the like.

As for the arrangement of the first electrodes 18a, a suitable arrangement that can be laid out in the band-shaped region 12L is possible. In the example shown in FIG. 7, the first electrodes 18a are disposed in two rows in the short dimension direction of the band-shaped region 12L. A plurality of first electrodes 18a are arrayed with a suitable interval in the long dimension direction of the band-shaped region 12L.

Although not illustrated, the first electrodes 18a are arranged in the same manner in the band-like region 12R.

The second substrate 13 is a module substrate in the electronic component 11.

As shown in FIG. 6, an electronic device 17 is mounted on a silicon interposer substrate 15. In other words, the electronic device 17 is mounted via the silicon interposer substrate 15 on the substrate surface 13a of the second substrate 13. The substrate surface 13a may also be called the second substrate surface.

The second substrate 13 may be constituted with a PWB similarly to the first substrate 12. However, the second substrate 13 may also be constituted with a material having a thermal expansion coefficient different from the thermal expansion coefficient of the first substrate 12. The thickness of the second substrate 13 may for example be the same as the first substrate 12, and may also be suitably selected as necessary from the standard thicknesses of a PWB.

The second substrate 13 may be formed with a material having a thermal expansion coefficient that is between the thermal expansion coefficient of the silicon interposer substrate 15 and the thermal expansion coefficient of the first substrate 12. In this case, compared to the case of the second substrate 13 being the same material as the first substrate 12, since the thermal expansion of the second substrate 13 is reduced, the required gap with the opening portion 12c is reduced. As a result, the effective surface area of the substrate surface 12a of the first substrate 12 is larger, and the strength of the first substrate 12 is higher.

The electronic device 17 includes one or more LSI devices. The type of LSI used as the electronic device 17 is not limited. The LSI used as the electronic device 17 may for example be a CPU, memory or the like.

The electronic device 17 may be BGA connected via the silicon interposer substrate 15 and an electrically conductive connecting member 16b.

The silicon interposer substrate 15 that the electronic device 17 is connected to may be BGA connected via an electrically conductive connecting member 16b to the substrate surface 13a of the second substrate 13.

As shown in FIG. 5, an electrically conductive pattern 19 is formed on the substrate surface 13a side of the second substrate 13. The electrically conductive pattern 19 constitutes a circuit for making an electrical connection with terminal electrodes in the silicon interposer substrate 15.

The electrically conductive pattern 19 extends in the horizontal direction from the center portion region of the substrate surface 13a that overlaps the arrangement position of the silicon interposer substrate 15 toward the peripheral edge portion of the substrate surface 13a. In the present exemplary embodiment, electrically conductive patterns 19 respectively extend toward the peripheral edge portion on the left and right sides in FIG. 5. Here, "center portion" and "peripheral edge portion" in the second substrate 13 are defined similarly to "center portion" and "peripheral edge portion" in the second substrate 3 of the first exemplary embodiment.

At each peripheral edge portion in the horizontal direction of the figure, a plurality of second electrodes 19a (refer to FIG. 7) are formed at the band-shaped regions 13L and 13R along the outer periphery portion 13c of the second substrate 13. The second electrode 19a makes an electrical connection between the electrically conductive pattern 19 and the connecting member 14 described below.

As shown in the example of the band-shaped region 13L in FIG. 7, the second electrodes 19a are pad-like electrodes. Each second electrode 19a is provided at the distal end portion of a wire 19b of the electrically conductive pattern 19 extending toward the band-shaped region 13L. The shape in plan view of the second electrode 19a is not particularly limited, provided the shape allows the arrangement of the electrically conductive joining member 14c described below. The shape in plan view of the second electrode 19a may for example be a circle, a polygon or the like.

As for the arrangement of the second electrodes 19a, a suitable arrangement that can be laid out in the band-shaped region 13L is possible. In the example shown in FIG. 7, the second electrodes 19a are arrayed in two rows in the short dimension direction of the band-shaped region 13L. A plurality of second electrodes 19a are arranged with a suitable interval in the long dimension direction of the band-shaped region 13L.

Although not illustrated, the second electrodes 19a are arrayed in the same manner in the band-like region 13R.

The connecting member 14 connects the first substrate 12 and at least a portion of the peripheral edge portion of the second substrate 13. In the electronic component 11, the first substrate 12 and the second substrate 13 are not connected by a member other than the connecting member 14.

The connecting member 14 may also be connected with the peripheral edge portion of the second substrate 13 over the entire peripheral edge portion of the second substrate 13. However, in the electronic component 11 illustrated in FIG. 7, the connecting member 14 is connected to the peripheral edge portions on the left and right of the second substrate 13. That is, the connecting member 14 includes the connecting member 14L that is arranged straddling the band-shaped regions 12L and 13L and the connecting member 14R that is arranged straddling the band-shaped regions 12R and 13R.

Since the connecting members 14L and 14R have approximately the same constitution, hereinbelow a description will be given focusing on the constitution of the connecting member 14L.

As shown in FIG. 6, the connecting member 14L includes a flexible substrate 14a and an electrically conductive joining member 14c. The electrically conductive joining member 14c may also be called a joining member.

The flexible substrate 14a has a rectangular exterior shape in plan view capable of covering both the band-shaped regions 12L and 13L in the state where the second substrate 13 is inserted in the opening portion 12c of the first substrate 12.

A resin film having flexibility is used as the substrate of the flexible substrate 14a.

The thickness of the substrate of the flexible substrate 14a is not particularly limited, provided it has flexibility allowing easy deformation compared with the first substrate 12 and the second substrate 13. For example, the thickness of the flexible substrate 14a may be 0.1 mm or more and 1.0 mm or less.

Examples of a preferred resin material for the substrate of the flexible substrate 14a include polyimide resin, liquid crystal polymer resin, and the like. It is more preferable that the elastic modulus of the material of the flexible substrate 14a be lower than the elastic modulus of the substrate material used for the first substrate 12 and the second substrate 13. In this case, the flexible substrate 14a, by having an elastic modulus that is low compared with the elastic modulus of the material of the first substrate 12 and the second substrate 13, readily deforms compared to the first substrate 12 and the second substrate 13.

The flexible substrate 14a includes an electrically conductive pattern 14b. The electrically conductive pattern 14b makes a conductive path between the first electrodes 18a and the second electrodes 19a. As shown in FIG. 7, the electrically conductive pattern 14b includes first electrode pads 14d, second electrode pads 14f, and wires 14e.

The first electrode pads 14d are arrayed in the same positional relationship as the first electrodes 18a of the band-shaped region 12L, in order to respectively oppose the first electrodes 18a in the band-shaped region 12L.

The second electrode pads 14f are arrayed in the same positional relationship as the second electrodes 19a of the band-shaped region 13L, in order to respectively oppose the second electrodes 19a in the band-shaped region 13L.

The first electrode pads 14d and the second electrode pads 14f are all exposed at the lower surface of the flexible substrate 14a in the figure.

The ends of each wire 14e in the lengthwise direction are respectively connected to a first electrodes pad 14d and a second electrode pad 14f.

The electrically conductive joining member 14c is a member that electrically connects the connecting member 14L to the first electrode 18a and the second electrode 19a, and fixes the connecting member 14L to the first substrate 12 and the second substrate 13.

The electrically conductive joining member 14c joins the mutually facing first electrode pad 14d and first electrode 18a and the mutually facing second electrode pad 14f and second electrode 19a in a state of being sandwiched therebetween. For this reason, the electrically conductive joining member 14c is disposed in four rows in the short dimension direction of the flexible substrate 14a.

As the electrically conductive joining member 14c, for example solder, a conductive adhesive agent, or the like may be used. Representative examples of a conductive adhesive agent include silver paste.

When solder is used as the electrically conductive joining member 14c, a method of BGA joining using solder balls in the formation of the electrically conductive joining member 14c may be used.

The connecting member 14R includes the flexible substrate 14a, the electrically conductive pattern 14b, and the electrically conductive joining member 14c similarly to the connecting member 14L.

The flexible substrate 14a in the connecting member 14R has a rectangular exterior shape in plan view capable of covering both band-shaped regions 12R and 13R in the second substrate 13 that is inserted in the opening portion 12c of the first substrate 12.

The arrangement pattern and number of the first electrode pads 14d and second electrode pads 14f in the connecting member 14R is set to the arrangement pattern and number that can respectively oppose the first electrodes 18a and the second electrodes 19a in the band-shaped regions 12R and 13R.

In the electronic component 11 having such a constitution, as shown in FIG. 5, the second substrate 13 is inserted in the opening portion 12c of the first electrode 18a when seen in the direction perpendicular to the substrate surface 13a. In plan view, the band-shaped region 12L (12R) is mutually adjacent with the band-shaped region 13L (13R).

The connecting member 14L is joined with the first electrodes 18a and the second electrodes 19a in the band-shaped regions 12L and 13L via the electrically conductive joining members 14c, in the state of being overlapped on the band-shaped regions 12L and 13L. Similarly, the connecting member 14R is joined with the first electrodes 18a and the second electrodes 19a in the band-shaped regions 12R and 13R via the electrically conductive joining members 14c, in the state of being overlapped on the band-shaped regions 12R and 13R.

For this reason, the connecting members 14L and 14R electrically connect the electrically conductive patterns 19 and 18 electrically with the electrically conductive pattern 14b. Moreover, the electrically conductive joining member 14c are fixed with the mutually facing first electrode pad 14d and first electrode 18a and the mutually facing second electrode pad 14f and second electrode 19a, respectively.

In the electronic component 11, the second substrate 13 is connected with first substrate 12 by the connecting members 14L and 14R, which are a plurality of connecting members 14.

Moreover, the connecting members 14L and 14R are arranged in line symmetry around the symmetrical axis passing through the center of the second substrate 13.

As shown in FIG. 6, in the present exemplary embodiment in which the thickness of the second substrate 13 is approximately equivalent with the distance from the substrate surface 12a to the bottom surface portion 12d, the substrate surface 12a and the substrate surface 13a are arranged on approximately the same plane.

Since FIG. 6 is a schematic view, no gap is shown between the substrate surface 13b and the bottom surface portion 12d, but this is just an example. In accordance with warpage and the like, there may be a gap between the substrate surface 13b and the bottom surface portion 12d. Moreover, depending on the thickness of the second substrate 13 and the operation direction of gravity, the substrate surface 13b and the bottom surface portion 12d may be mutually separated.

The electronic component 11 with such a constitution can be manufactured by the electronic component manufacturing method of the present exemplary embodiment.

Figure 9A:
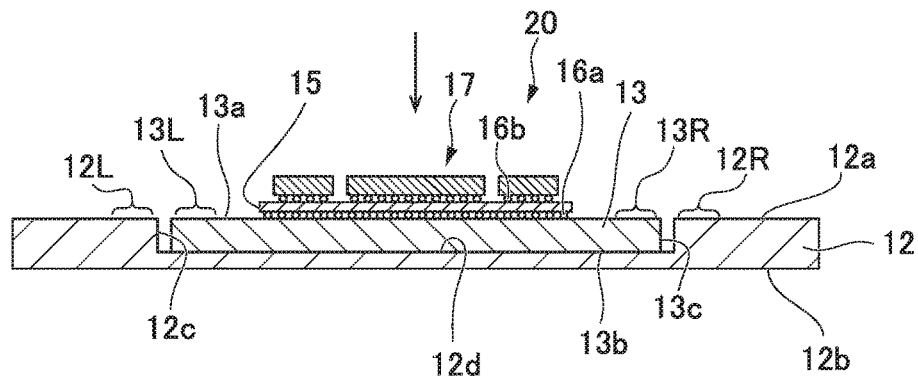
FIG. 9A is a process description view in one example of the manufacturing method of the electronic component of the second exemplary embodiment of the present invention.
Figure 9B:
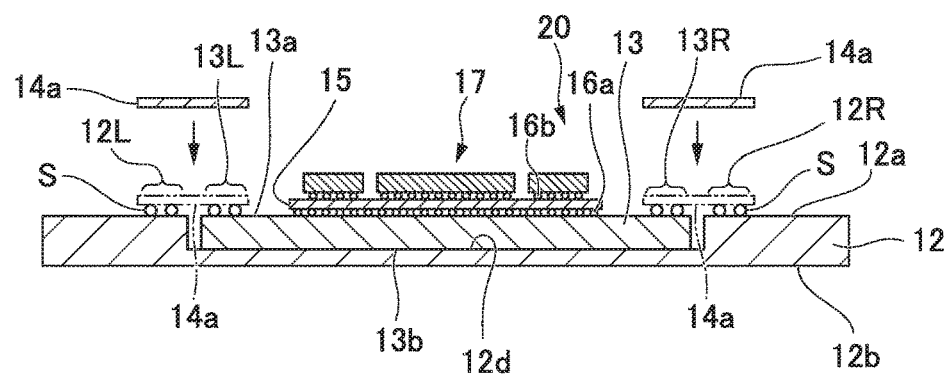
FIG. 9B is a process description view in the one example of the manufacturing method of the electronic component of the second exemplary embodiment of the present invention.
Figure 9C:
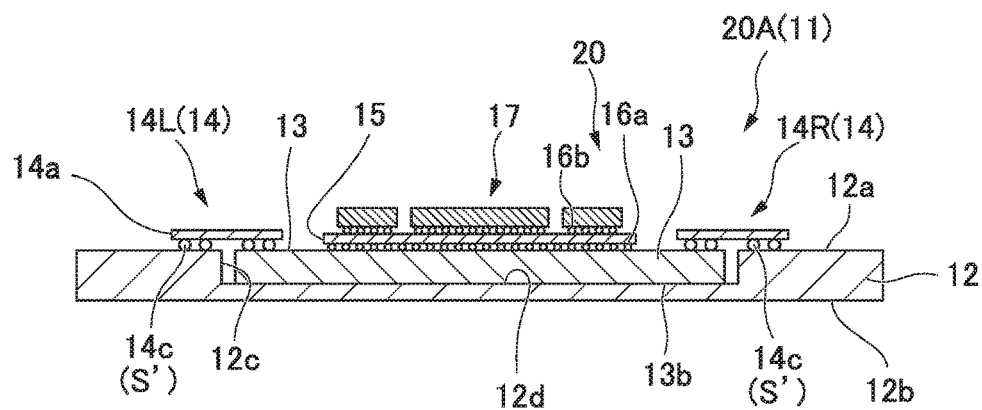
FIG. 9C is a process description view in the one example of the manufacturing method of the electronic component of the second exemplary embodiment of the present invention.

FIG. 8 is a flowchart that shows an example of the electronic component manufacturing method of the second exemplary embodiment. FIGS. 9A to 9C are step description views in one example of the electronic component manufacturing method of the second exemplary embodiment of the present invention.

By the electronic component manufacturing method of the present exemplary embodiment, when manufacturing the electronic component 11, for example, steps S1 through S4 shown in FIG. 8 are executed in accordance with the flow shown in FIG. 8.

In Step S1, the electronic device 17 is mounted on the second substrate 13. For example, the electronic device 17 is BGA mounted on the silicon interposer substrate 15 via the conductive connecting member 16b. Moreover, the silicon interposer substrate 15 on which the electronic device 17 has been mounted is BGA mounted on the substrate surface 13a of the second substrate 13 via the conductive connecting member 16a. As the BGA mounting method, a well-known suitable method may be used.

By doing so, an assembly 20 (refer to FIG. 9A) that is assembled by the second substrate 13, the silicon interposer substrate 15, and the electronic device 17 is manufactured.

After Step S1, Step S2 is performed. In Step S2, the second substrate 13 of the assembly 20 is arranged on the first substrate 12.

In the present exemplary embodiment, as shown in FIG. 9A, in the state of the substrate surface 12a of the first substrate 12 and the substrate surface 13a of the second substrate 13 made to face the same direction (the upward direction in the figure), the second substrate 13 is inserted in the opening portion 12c. The insertion position of the second substrate 13 is made the position in which an approximately equivalent gap is formed between the outer periphery portion 13c of the second substrate 13 and the opening portion 12c.

In this insertion step, the second substrate 13 is inserted in the state of the position in plan view being aligned with the opening portion 12c. By this alignment, the second substrate 13 is inserted in the state of the band-shaped region 12L (12R) and the band-shaped region 13L (13R) being mutually adjacent. Moreover, by this position alignment, the second substrate 13 is inserted in the state in which the first electrodes 18a and the second electrodes 19a in plan view have approximately the same relative position relation as the arrangement pattern of the first electrode pads 14d and the second electrode pads 14f on the flexible substrate 14a.

This concludes Step S2.

After Step S2, Step S3 is performed. In Step S3, the connecting member 14 is arranged straddling the first substrate 12 and the peripheral edge portion of the second substrate 13.

For example, in the case of the connecting member 14 being BGA connected, as shown in FIG. 9B, first, a solder ball S that serves as the electrically conductive joining member 14c is disposed on each of the first electrodes 18a and second electrodes 19a (not shown in the figure) in the band-shaped regions 12L (12R) and 13L (13R).

Afterward, the flexible substrate 14a (refer to the double-dot chain line in the figure) is arranged on the solder balls S. At this time, the flexible substrate 14a is arranged at the position where the first electrode pads 14d and the second electrode pads 14f face the first electrodes 18a and the second electrodes 19a. Each solder ball S is sandwiched between the first electrode 18a and the first electrode pad 14d or the second electrode 19a and the second electrode pad 14f.

Thus, as shown in FIG. 9C, an assembly 20A is formed in which the assembly 20, members serving as the conductive joining members 14c such as solder balls S, and the connecting members 14 are arranged in the aforementioned relation on the first substrate 12.

This concludes Step S3.

In the above description of Step S3, the example is described of the flexible substrates 14a and the solder balls S, which are constituent materials of the connecting member 14, being disposed in an unconnected state. However, the solder balls S may also be disposed in the state of being joined in advance with the first electrode pads 14d and the second electrode pads 14f of the flexible substrate 14a. For example, when a conductive adhesive agent is used as the electrically conductive joining member 14c, the electrically conductive joining members 14c may be applied or printed in advance on the first electrode pads 14*d* and the second electrode pads 14*f* of the flexible substrate 14*a*.

Step S4 is performed after Step S3. In Step S4, the first substrate 12 and the peripheral edge portion of the second substrate 13 are fixed by the connecting member 14.

When using the solder ball S to form the electrically conductive joining member 14*c*, the solder ball S is heated and melted. In order to carry out heating and melting of the solder ball S, the assembly 20A may for example be placed in a heating furnace.

When a molten substance S' of the solder ball S is formed, the first electrode pad 14*d* (second electrode pad 14*f*) and the first electrode 18*a* (second electrode 19*a*) are mutually connected by the molten substance S'. In this state, the heating is stopped. Specifically, for example, the assembly 20A is removed to the outside of the heating furnace.

Afterward, the electrically conductive joining member 14*c* is formed between the first electrode pad 14*d* (second electrode pad 14*f*) and the first electrode 18*a* (second electrode 19*a*) by the cooling and solidification of the molten substance S'.

When the electrically conductive joining member 14*c* is a conductive adhesive agent, by the hardening of the conductive adhesive agent using a suitable hardening means (for example, heat) in accordance with the type of conductive adhesive agent, the hardened electrically conductive joining member 14*c* is formed.

In this way, the connecting members 14L and 14R are formed by the formation of the electrically conductive joining members 14*c* that have hardened or solidified. As a result, the first substrate 12 and the second substrate 13 are fixed.

This concludes Step S4.

In this manner the electronic component 11 is manufactured.

The operation of the electronic component 11 having such a configuration will now be described.

Figure 10:
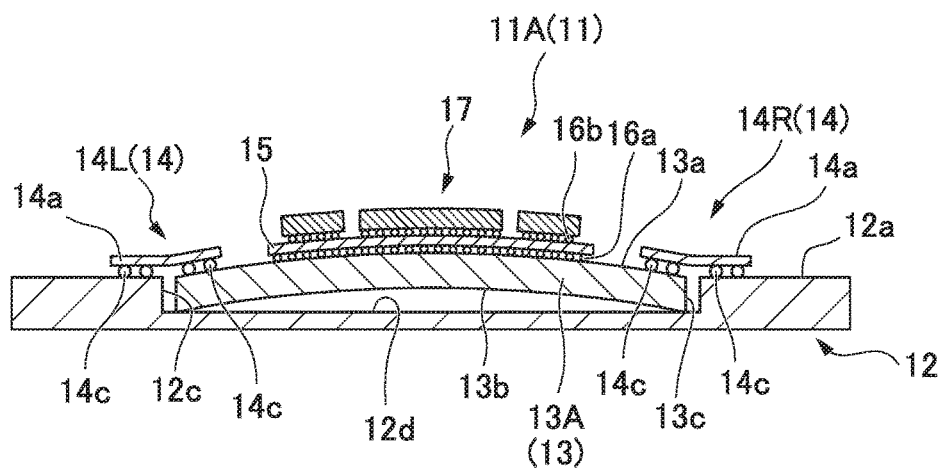
FIG. 10 is a schematic view for describing the operation of the electronic component of the second exemplary embodiment of the present invention.

FIG. 10 is a schematic view for describing the operation of an electronic component of the second exemplary embodiment of the present invention.

In the electronic component 11, for example, when mounting the silicon interposer substrate 15 on the second substrate 13, heating is required. For this reason, due to the same reason as described in the first exemplary embodiment above, warpage easily occurs in which the substrate surface 13*a* of the second substrate 13 becomes convex.

As shown in FIG. 10, the second substrate 13 in which the above-mentioned warpage occurs at a normal temperature is called the second substrate 13A. The second substrate 13A can be fixed to the first substrate 12 similarly to the second substrate 13 with no warpage by the aforedescribed electronic component manufacturing method of the present exemplary embodiment.

First, the second substrate 13A can be inserted without difficulty in the opening portion 12*c* in Step S2 mentioned above. However, the second substrate 13A is inserted in the opening portion 12*c* in the state of the peripheral edge portion of the substrate surface 13*b* in contact with the bottom surface portion 12*d*. For this reason, the center portion of the substrate surface 13*a* projects more to the outside of the opening portion 12*c* than the substrate surface 12*a* depending on the warpage amount. However, the peripheral edge portion of the substrate surface 13*a*, by being inclined only slightly in accordance with the warpage amount, is positioned on approximately the same plane as the adjacent substrate surface 12*a*.

For example, suppose that the width of the second substrate 13 is 50 mm, the warpage amount is 0.5 mm, and the arrangement pitch of the electrically conductive joining members 14*c* in the short dimension direction is 1.0 mm. Since the diameter of the solder ball used for the BGA connection is about 0.6 mm, when carrying out BGA connections at the center of the second substrate 13, connection failure readily occurs.

However, such warpage has substantially less of an effect at the peripheral edge portion of the second substrate 13. For example, assuming for convenience that the amount of warpage can be distributed proportionally, the inclination angle at the peripheral edge portion is the minute amount of around 1.1°. The difference in height produced by such an inclination between the electrically conductive joining members 14*c* arranged in the short dimension direction is the minute amount of just 0.02 mm. An inclination of this level does not pose a problem for BGA connection.

When using a conductive adhesive as the electrically conductive joining member 14*c*, since an uncured conductive adhesive has mobility, even less difficulty is encountered at such an inclination.

For this reason, in present exemplary embodiment, when the second substrate 13A is used, in Step S3 described above, the flexible substrate 14*a* is arranged without difficulty similarly to the case of using the second substrate 13 having no warpage.

The flexible substrate 14*a* has flexibility and further softens with heating. For this reason, in Step S4, when the flexible substrate 14*a* additionally undergoes heating, the flexible substrate 14*a* can be easily brought into close contact with the upper portion of the solder balls S placed on the substrate surfaces 12*a* and 13*a*. For this reason, even with warpage in the manner of the second substrate 13A, the first substrate 12 and the second substrate 13A are fixed by the connecting members 14 similarly to the case of no warpage.

Although abbreviated in the figure, when there is a risk of warpage occurring in which the substrate surface 13*a* of the second substrate 13 becomes concave in the manner of the second substrate 3B described in the first exemplary embodiment, the position of the bottom surface portion 12*d* should be deepened. Specifically, the position of the bottom surface portion 12*d* should be such that, even in the state of the second substrate 13 being warped, the entire second substrate 13 can still be accommodated within the opening portion 12*c*. In this case, the position of the peripheral edge portion of the second substrate 13 arranged on the bottom surface portion 12*d* is equal to or below the substrate surface 12*a*, in accordance with the warpage amount and warpage direction of the second substrate 13.

For example, in accordance with the warpage amount and warpage direction, a state in which the peripheral edge portion of the second substrate 13 is located on approximately the same plane as the substrate surface 12*a* is formed by changing and maintaining the height of the assembly 20 with respect to the bottom surface portion 12*d*. By doing so, even if the direction of warpage is opposite, the first substrate 12 and the second substrate 13A are fixed by the connecting members 14 in approximately the same manner as above.

According to the present exemplary embodiment, since the band-shaped region 12L (12R) and the band-shaped region 13L (13R) are in a mutually adjacent positional relation in plan view, the peripheral edge portion of substrate surface 13*a* and the substrate surface 12*a* do not mutually overlap in plan view. For this reason, in the state of the positions of the first substrate 12 and the second substrate 13 being fixed, the flexible substrate 14a is arranged at a connecting location by moving the flexible substrate 14a in the opposing region of the band-shaped regions 12L (12R) and 13L (13R). Since the flexible substrate 14a is lightweight compared to the first substrate 12 and second substrate 13, it is easy to move and so the movement accuracy can be improved.

In the present exemplary embodiment, the connecting member 14 is connected only to the peripheral edge portion of the second substrate 13. For this reason, even if there is warpage in the second substrate 13, the second substrate 13 is fixed to the first substrate 2 via the connecting member 14, with no connection failure occurring.

In particular in the present exemplary embodiment, the connecting member 14 includes the flexible substrate 14a. For this reason, even if the peripheral edge portion of the substrate surface 13a is inclined with respect to the substrate surface 12a, arrangement of the connecting member 14 along the inclination is possible. As a result, more reliable connection and anchoring are performed compared to the case where a connecting member not having flexibility is used.

In the electronic component 11 (11A) that is thus manufactured, only the peripheral edge portion of the second substrate 13 (13A) is constrained by the connecting member 14, similarly to the electronic component 1 of the first exemplary embodiment. As a result, when the second substrate 13 (13A) undergoes thermal expansion due to the generation of heat by an electronic device after the fixing of the second substrate 13 (13A), compared to the case of the center portion being constrained, the second substrate 13 (13A) easily undergoes deformation. Since the thermal stress is absorbed to some extent by the deformation of the second substrate 13 (13A) itself, the stress load on the connecting member 14 and the first substrate 12 is reduced.

Moreover, the flexible substrate 14a of the connecting member 14 has flexibility. For this reason, even if the inclination of the peripheral edge portion of the substrate surface 13a with respect to the substrate surface 12a has changed due to a change in the warpage amount of the second substrate 13, the connecting member 14 is able to follow the change in the inclination by means of the deformation of the flexible substrate 14a. As a result, the stress load on the electrically conductive joining member 14c and the first substrate 12 due to the heat deformation of the second substrate 13 is reduced further.

Also in the case of a difference in the relative thermal expansion amounts of the first substrate 12 and the second substrate 13 arising due to a rise in the usage environment temperature of the electronic component 11 (11A), since the stress that occurs in the connecting member 14 can be reduced by the second substrate 13 itself being easily deformable or the flexible substrate 14a of the connecting member 14 being easily deformable, breakage and the like of the connecting member 14 is prevented.

Factors of the second substrate 13 being easily deformable include the center portion of the second substrate 13 not being constrained and the second substrate 13 being arranged within the opening portion 12c with a gap opened with the opening portion 12c in plan view.

Other factors of being able to reduce the stress generated in the connecting member 14 include the electrically conductive joining member 14c being provided at two locations separated in the short dimension direction in each of the band-shaped regions 12L (12R) and 13L (13R). The thermal stress generated in the short dimension direction by such a connection is distributed to the two electrically conductive joining members 14c arranged in parallel. For this reason, compared with the case where the electrically conductive joining member 14c is arranged at one location in the short dimension direction, the stress acting on the joint of electrically conductive joining member 14c is reduced.

Moreover, when the electrically conductive joining member 14c of the connecting member 14 is constituted from a material that is deformable by the thermal stress generated by the thermal expansion of the second substrate 13 or the first substrate 12, the thermal stress is also absorbed by the deformation of the electrically conductive joining member 14c itself in addition to the aforementioned deformation of the second substrate 13 and the flexible substrate 14a.

For this reason, since the stress load on the connection portions between the electrically conductive joining member 14c, and the second substrate 13 and first substrate 12 is reduced, the reliability of the connection in connecting member 14 improves.

As described above, even if the electronic component 11 of the present exemplary embodiment includes substrates having different thermal expansion coefficients, manufacturing is easy and reliability is favorable.

Third Exemplary Embodiment

The electronic component according to the third exemplary embodiment of the present invention will be described.

Figure 11:
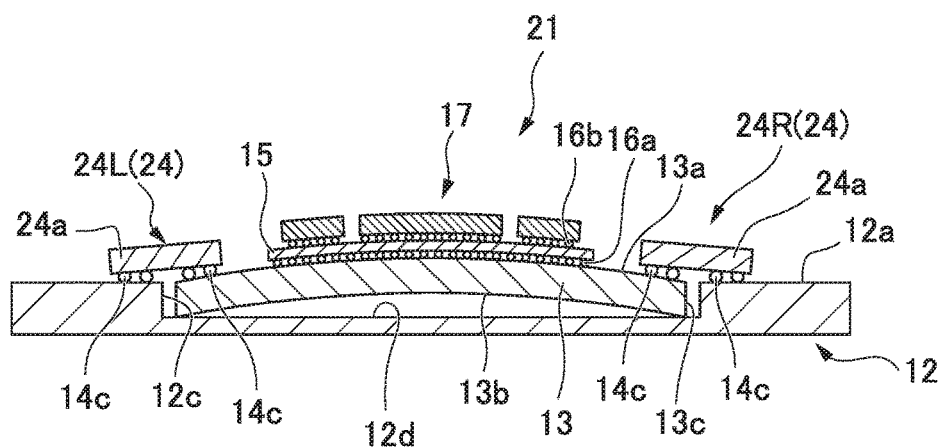
FIG. 11 is a schematic cross-sectional view showing an example of the electronic component of the third exemplary embodiment of the present invention.

FIG. 11 is a schematic cross-sectional view showing one example of the third exemplary embodiment of the present invention.

As shown in FIG. 11, the electronic component 21 of the present exemplary embodiment includes a connecting member 24 in place of the connecting member 14 of the electronic component 11 of the second exemplary embodiment. The description that follows will focus on the points of difference with the second exemplary embodiment given above.

The connecting member 24 includes connecting members 24L and 24R in place of connecting members 14L and 14R, respectively, of the second exemplary embodiment.

The connecting member 24L (24R) includes a connection substrate 24a in place of the flexible substrate 14a of the connecting member 14L (14R).

In the connection substrate 24a, a material of higher rigidity than the substrate of the flexible substrate 14a is used as the material of the substrate. For this reason, the connection substrate 24a does not have flexibility like the flexible substrate 14a.

However, as the material of the substrate of the connection substrate 24a, a material is selected having a third thermal expansion coefficient of a magnitude between the first thermal expansion coefficient of the first substrate 12 and the second thermal expansion coefficient of the second substrate 13. It is more preferable that the third thermal expansion coefficient have a value closer to the average value of the first thermal expansion coefficient and the second thermal expansion coefficient than to either the first thermal expansion coefficient or the second thermal expansion coefficient.

The operation of the electronic component 21 having such a configuration will now be described, focusing on the points of difference with the second exemplary embodiment.

The electronic component 21 of the present exemplary embodiment differs from the second exemplary embodiment on the point of the connection substrate 24a not having flexibility. For this reason, the present exemplary embodiment has the same operation as the second exemplary embodiment, excluding the operation that relies on the flexibility of the flexible substrate 14a.

For this reason, the electronic component 21 is easily manufactured, similarly to the second exemplary embodiment.

In relation to thermal expansion, the third exemplary embodiment is the same as the first exemplary embodiment, in that the stress load to the connecting member 24 and the first substrate 12 is reduced by the deformation of the second substrate 13 and the electrically conductive joining member 14c. Moreover, the stress reduction effect due to the electrically conductive joining member 14c being arranged in two rows in the short dimension direction in each of the band-shaped regions 12L (12R) and 13L (13R) is the same as that of the second exemplary embodiment.

On the other hand, in the present exemplary embodiment, since the connection substrate 24a has higher rigidity than the flexible substrate 14a, the operation of absorbing thermal stress by flexure deformation is inferior to that of the second exemplary embodiment.

However, in the present exemplary embodiment, the third thermal expansion coefficient of the connection substrate 24a has a value between the first thermal expansion coefficient of the first substrate 12, and the second thermal expansion coefficient of the second substrate 13. This kind of connection substrate 24a is connected straddling the first substrate 12 and the second substrate 13. For this reason, the thermal stress generated by the difference between the thermal expansion coefficients is distributed by each of the connection portion of the first substrate 12 and the connection substrate 24a, and the connection portion of the second substrate 13 and the connection substrate 24a. That is, since a transition region with a quasi-thermal expansion coefficient is formed between the first substrate 12 and the second substrate 13 by the interposition of the connection substrate 24a, the thermal stress due to the difference in thermal expansion coefficients is dispersed in the range of overlap with the connection substrate 24a.

In the present exemplary embodiment, the stress to the joint of electrically conductive joining member 14c is reduced also by the operation of such a connection substrate 24a.

As described above, even if the electronic component 21 of the present exemplary embodiment includes substrates having different thermal expansion coefficients, manufacturing is easy and reliability is favorable.

Fourth Exemplary Embodiment

The electronic component according to the fourth exemplary embodiment of the present invention will be described.

Figure 12A:
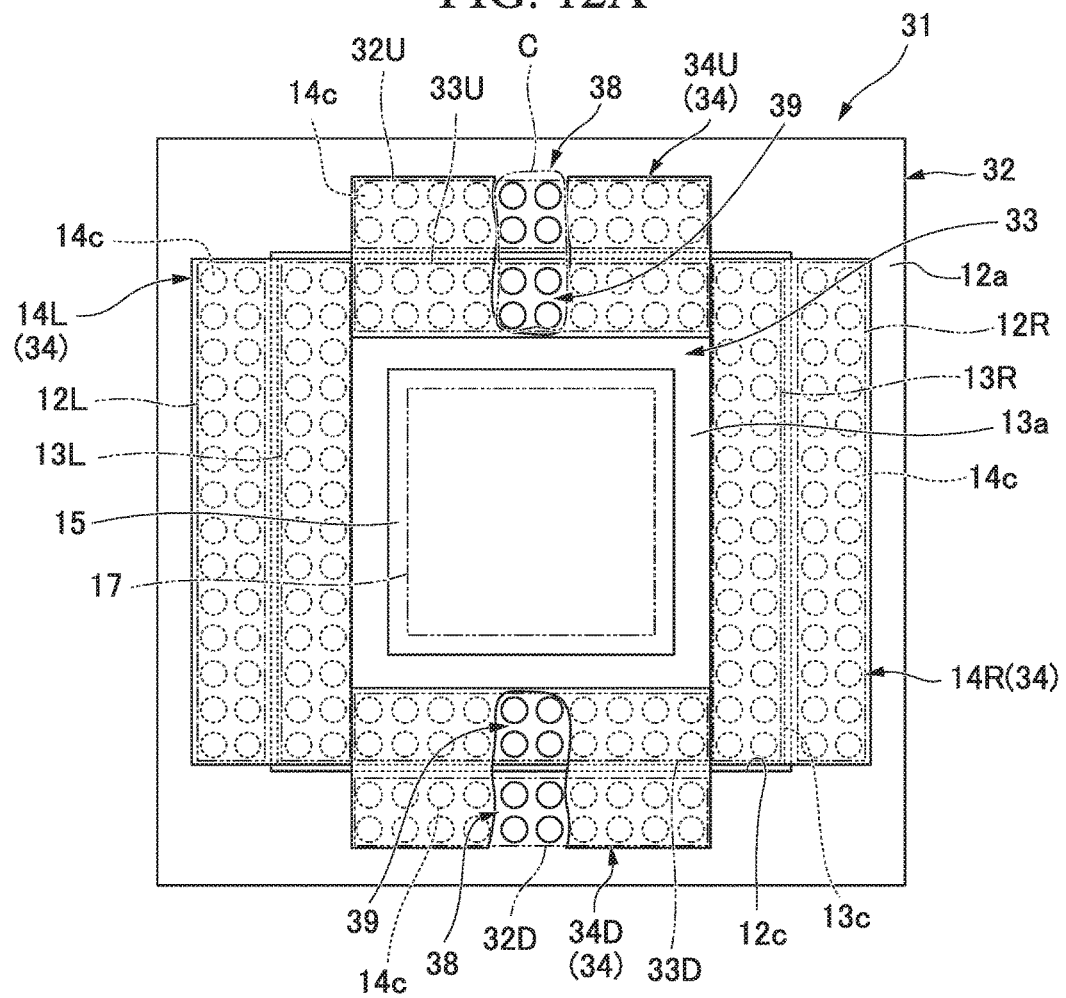
FIG. 12A is a schematic plan view showing an example of the electronic component of the fourth exemplary embodiment of the present invention.
Figure 12B:
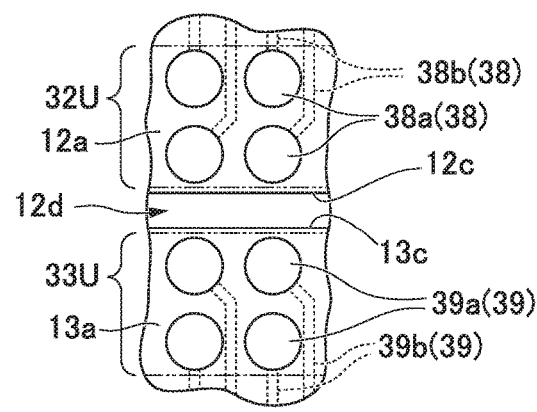
FIG. 12B is a detailed view of Part C in FIG. 12A.

FIG. 12A is a schematic plan view that shows an example of the electronic component of the fourth exemplary embodiment of the present invention. FIG. 12B is a detailed view of Part C in FIG. 12A.

As shown in FIG. 12A, an electronic component 31 of the present exemplary embodiment includes a first substrate 32, a second substrate 33, and a connecting member 34 in place of the first substrate 12, the second substrate 13, and the connecting member 14, respectively, of the electronic component 11 of the second exemplary embodiment.

In the second exemplary embodiment given above, the connecting member 14 is provided in a circumferential portion of the peripheral edge portion of the second substrate 13. In the present exemplary embodiment, the connecting member 34 is provided over the entire circumference of the peripheral edge portion of the second substrate 23 so as to surround the center portion of the second substrate 23.

Hereinbelow, the description that follows will focus on the points of difference with the second exemplary embodiment.

The first substrate 32 is constituted by an electrically conductive pattern 38 being added to the substrate surface 12a side of the first substrate 12 in the second exemplary embodiment.

The electrically conductive pattern 38 constitutes a circuit for connecting electrically with connecting members 34U and 34D described below.

The electrically conductive pattern 38 extends in a suitable direction from the vicinity of the opening portion 12c in the vertical direction of the figure in accordance with the arrangement position of the connecting members 34U and 34D described below.

In the vicinity of the opening portion 12c on the upper side (lower side) of the figure, a plurality of first electrodes 38a (refer to FIG. 12B) similar to the first electrodes 18a are formed in the band-shaped region 32U (32D) extending along the opening portion 12c. The band-shaped region 32U (32D) is formed at a position mutually opposed, in the vertical direction of the figure, with a band-shaped region 33U (33D) described below.

The first electrode 38a makes an electrical connection between the electrically conductive pattern 38 and the connecting member 34U (34D) described below. A wire 38b is connected to each first electrode 38a.

As for the arrangement of the first electrodes 38a, a suitable arrangement that can be laid out in the band-shaped region 32U (32D) is possible. In the example shown in FIG. 12B, the first electrodes 38a are disposed in two rows in the short dimension direction (vertical direction in the figure) of the band-shaped region 32U. A plurality of first electrodes 38a are arranged with a suitable interval in the long dimension direction of the band-shaped region 32U. Although not illustrated, the arrangement of the first electrodes 38a in the band-shaped region 32D is also the same.

As shown in FIG. 12A, the second substrate 33 is constituted by adding an electrically conductive pattern 39 to the substrate surface 13a side of the second substrate 33 in the second exemplary embodiment.

The electrically conductive pattern 39 constitutes a circuit for making an electrical connection with terminal electrodes in the silicon interposer substrate 15.

As shown in FIG. 12A, the electrically conductive pattern 39 extends in the vertical direction of the figure from the region of the center portion of the substrate surface 13a that overlaps the arrangement position of the silicon interposer substrate 15 toward the peripheral edge portion of the substrate surface 13a.

In the peripheral edge portion on the upper side (lower side) of the figure, a plurality of second electrodes 39a (FIG. 12B) similar to the second electrodes 19a are formed in the band-shaped region 33U (33D) along the outer periphery portion 13c of the second substrate 33. The band-shaped region 33U (33D) is formed between the band-shaped regions 13L and 13R in the same manner as the second exemplary embodiment. For this reason, the band-shaped regions 33U, 13R, 33D, and 13L are regions covering the entire peripheral edge portion of the second substrate 33.

The second electrode 39a makes an electric connection between the electrically conductive pattern 39 and the connecting member 34U (34D) described below. A wire 39b is connected to each second electrode 39a.

As for the arrangement of the second electrodes 39a, a suitable arrangement that can be laid out in the band-shaped region 33U (33D) is possible. In the example shown in FIG. 12B, the second electrodes 39a are disposed in two rows in the short dimension direction of the band-shaped region 33U, and a plurality of two rows of second electrodes 39a are arranged with a suitable interval in the long dimension direction. Although not illustrated, the arrangement of the second electrodes 39a in the band-shaped region 33D is also the same.

The connecting member 34 further includes connecting members 34U and 34D, in addition to the connecting members 14L and 14R of the second exemplary embodiment.

However, in FIG. 12A, for convenience illustration of the electrically conductive pattern 14b in the connecting member 34 is abbreviated.

The connecting member 34U (34D) includes the same configuration as the connecting member 14L (14R) except that the length in the long dimension direction and the arrangement position differ.

Although the connecting members 34U and 34D may have mutually different shapes, in the example shown in FIG. 12A, the connecting members 34U and 34D have shapes that are line-symmetrical with respect to a symmetry axis passing through the center of the second substrate 33.

The connecting member 34U (34D) is arranged straddling the band-shaped regions 32U and 33U (32D, 33D). The connecting member 34U (34D) electrically connects together and fixes the first substrate 32 and the second substrate 33 via the electrically conductive joining members 14c.

The electronic component 31 having such a configuration is manufactured similarly to the electronic component 11 of the second exemplary embodiment except for using the connecting member 34 in place of the connecting member 14.

The operation of the electronic component 31 having such a configuration will be described focusing on points of difference with the second exemplary embodiment.

Since the first substrate 32 and the second substrate 33 in the electronic component 31 are connected by the connecting members 14L, 14R, 34U, and 34D, the entire region of the peripheral edge portion of the second substrate 33 is used for the connection. For this reason, compared to the second exemplary embodiment, connection via a greater number of lead wires is possible. Thereby, electronic devices 17 can be mounted more densely and it is possible to increase the number of signals to the electronic devices 17.

As such a connection structure that uses the entire circumferential region of the peripheral edge portion, it is also possible to use one connecting member in which for example the connecting members 14L, 14R, 34U, and 34D are integrated.

However, in the case of the connecting member being split into a plurality of parts as in the present exemplary embodiment, since the yield rate increases, the component cost is further reduced.

Moreover, in the case of the present exemplary embodiment, even if the height of the substrate surface 13a varies by location with respect to the substrate surface 12a, since it is possible to absorb the height difference at each connecting member, joining defects are easily reduced.

According to the electronic component 31 of the present exemplary embodiment described above, in the same manner as the second exemplary embodiment, even if the electronic component 31 includes substrates having different thermal expansion coefficients, manufacture is easy and reliability is favorable.

Fifth Exemplary Embodiment

The electronic component according to the fifth exemplary embodiment of the present invention will be described.

Figure 13:
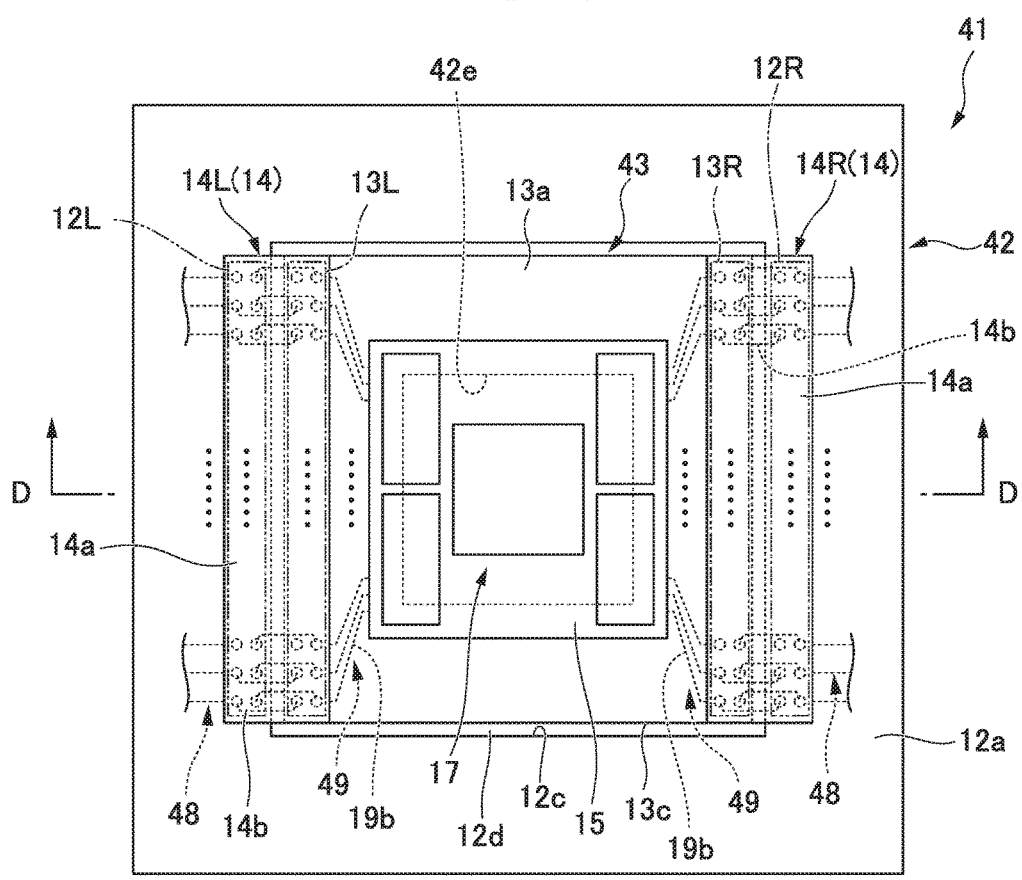
FIG. 13 is a schematic plan view showing an example of the electronic component of the fifth exemplary embodiment of the present invention.
Figure 14:
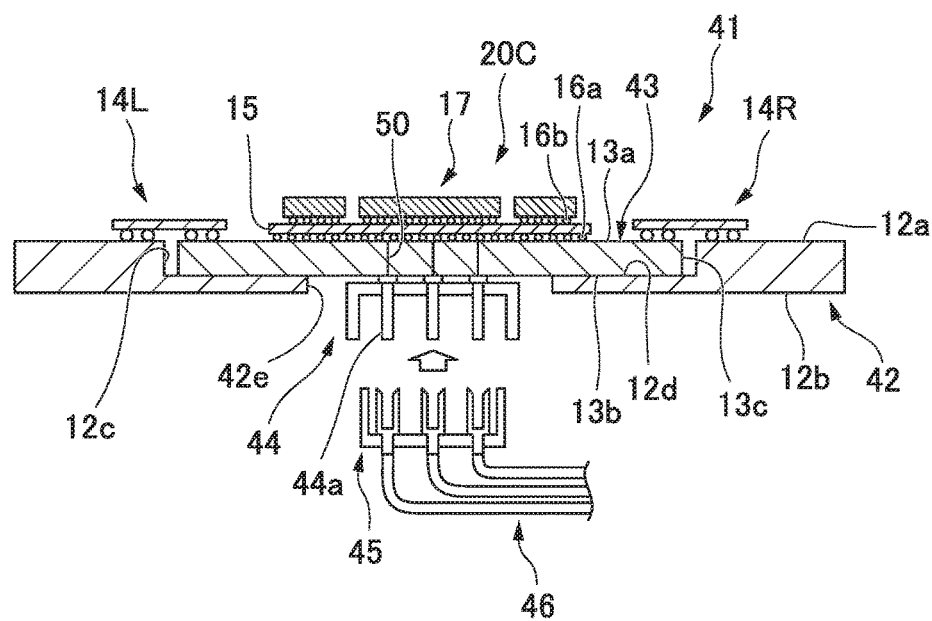
FIG. 14 is a cross-sectional view along D-D in FIG. 13.

FIG. 13 is a schematic plan view showing an example of the electronic component of the fifth exemplary embodiment of the present invention. FIG. 14 is a cross-sectional view along D-D in FIG. 13.

As shown in FIG. 13 and FIG. 14, the electronic component 41 of the present exemplary embodiment includes a first substrate 42 and a second substrate 43 in place of, respectively, the first substrate 12 and the second substrate 13 of the electronic component 11 of the second exemplary embodiment.

Hereinbelow, a description will be given focusing on the points of difference with the second exemplary embodiment.

The first substrate 42 differs from the second exemplary embodiment on the point of a through hole 42e being formed in the bottom surface portion 12d of the first substrate 12, and the point of an electrically conductive pattern 48 being formed in place of the electrically conductive pattern 18.

The through hole 42e includes a size and shape allowing insertion of a power feed electrode portion 44 described below provided in the center portion of the second substrate 33.

The electrically conductive pattern 48 has the same configuration as the electrically conductive pattern 18. However, only input/output data signals of the electronic device 17 are transmitted in the electrically conductive pattern 48.

The second substrate 43 includes an electrically conductive pattern 49 (refer to FIG. 13) and an electrically conductive pattern 50 (refer to FIG. 14) in place of the electrically conductive pattern 19 of the second substrate 13 in the second exemplary embodiment. The second substrate 42 further includes a power feed electrode portion 44.

As shown in FIG. 13, the electrically conductive pattern 49 has the same configuration as the electrically conductive pattern 19. However, only input/output data signals of the electronic device 17 are transmitted in the electrically conductive pattern 49.

As shown in FIG. 14, the electrically conductive pattern 50 is wiring used as a power supply line in the electronic device 17. The electrically conductive pattern 50 is extended in the board thickness of the second substrate 43 from the connection electrode with the silicon interposer substrate 15 in the substrate surface 13a toward the substrate surface 13b. In the present exemplary embodiment, the electrically conductive pattern 50 is provided so as to overlap with the center portion of the silicon interposer substrate 15 in plan view.

The power feed electrode portion 44 includes third electrodes 44a that are electrically connected with the electrically conductive pattern 50. The third electrodes 44a are electrodes for connecting with a power supply line.

The power feed electrode portion 44 is arranged in a region overlapping with the center portion of the silicon interposer substrate 15 in plan view, similarly to the electrically conductive pattern 50.

Since the third electrodes 44a are connected with the power supply line, compared with the data signals the number of third electrodes 44a is significantly less. For this reason, the small region overlapping the center portion of the silicon interposer substrate 15 is sufficient for the arrangement space of the third electrodes 44a. Regarding the size of the third electrode 44a, it is possible to use a large electrode capable of passing a large current.

The type of the power feed electrode portion 44 and the type of the third electrode 44a are not particularly limited provided they are capable of supplying power.

For example, the power feed electrode portion 44 may be provided to be detachable with a connector. For example, FIG. 14 shows the power feed electrode portion 44 that is connectable with a connector 45 of a cable 46 connected to the power supply. Since FIG. 14 is a schematic, the example of the third electrode 44a is drawn with three pin-shaped electrodes. However, the shape and number of the third electrode 44a is not limited thereto. The third electrode 44a may be constituted with two or more electrodes including a ground terminal and one or more voltage terminals. The power feed electrode portion 44 projects to the lower side of the figure through the through hole 42e.

For example, a power feeding substrate with which a power supply circuit for power supply is connected may be joined with the power feed electrode portion 44. In this case, since the power feed electrode portion 44 is provided on the substrate surface 13b on the rear side of the center portion of the silicon interposer substrate 15, the range of the power feed electrode portion 44 is a region with particularly little warpage in the second substrate 43. For this reason, when joining the power feeding substrate, it is possible to improve the reliability of the connection by using a BGA joining structure.

The electronic component 41 with such a configuration is manufactured in the same manner as the second exemplary embodiment, other than the first substrate 42 and the assembly 20C being used in place of the first substrate 12 and the assembly 20. The assembly 20C is constituted by the silicon interposer substrate 15, the electronic device 17, and the power feed electrode portion 44 being mounted on the second substrate 43.

The operation of the electronic component 41 having such a configuration will be described, focusing on the points of difference with second exemplary embodiment.

According to the electronic component 41 of the present exemplary embodiment, only input/output data signals of the electronic device 17 are transmitted in the electrically conductive patterns 48 and 49. Similarly, the electrically conductive pattern 14b in the connecting member 14 is also used for transmitting data signals. For this reason, a configuration is possible in which the cross-sectional area of the wiring is reduced compared to the case of the electrically conductive pattern 14b including the power supply wiring. Thereby, the flexibility of the connecting member 14 further improves. For this reason, it becomes easier to absorb the initial warpage of the second substrate 43 or deformation caused by thermal expansion during use.

In the electronic component 41, since the electrically conductive patterns 48 and 49 need not contain power supply wiring, which has a large cross-sectional area, wiring of a high density in relation to the substrate area of the second substrate 43 becomes possible. For this reason, it is possible to densely mount electronic devices 17 on the silicon interposer substrate 15.

In the electronic component 41 illustrated in FIG. 14, the electric power required for driving the electronic device 17 is supplied to the power feed electrode portion 44 via the cable 46. The thickness of the electric wire used for the cable 46 is chosen as needed. For this reason, it is possible to efficiently supply power through the cable 46 even when large power is required.

Moreover, since the electrically conductive pattern 50 is of a length penetrating the thickness of the second substrate 43, the voltage drop and Joule heating due to the electrical resistance of the electrically conductive pattern 50 are reduced. For this reason, compared with the case where the power supply line is included in the electrically conductive patterns 48 and 49, the Joule heating in the first substrate 22 and the second substrate 43 can be reduced.

The arrangement area of the power feed electrode portion 44 is a region facing the central portion of the silicon interposer substrate 15 where warpage and deformation due to thermal expansion is small compared with other regions of the second substrate 43.

For this reason, in the connection portion with the power feed electrode portion 44 and the electrically conductive pattern 50, stress due to thermal expansion of the second substrate 43 has less of a tendency to occur. As a result, the reliability of the connection of the power supply line improves in the present exemplary embodiment.

According to the electronic component 41 of the present exemplary embodiment described above, in the same manner as the second exemplary embodiment, even if the electronic component 41 includes substrates having different thermal expansion coefficients, manufacture is easy and reliability is favorable.

In particular, when large power is required for driving of the electronic device 17 in the electronic component 41 of the present exemplary embodiment, a power saving and lower heat generating configuration is obtained.

Sixth Exemplary Embodiment

The electronic component according to the sixth exemplary embodiment of the present invention will be described.

Figure 15:
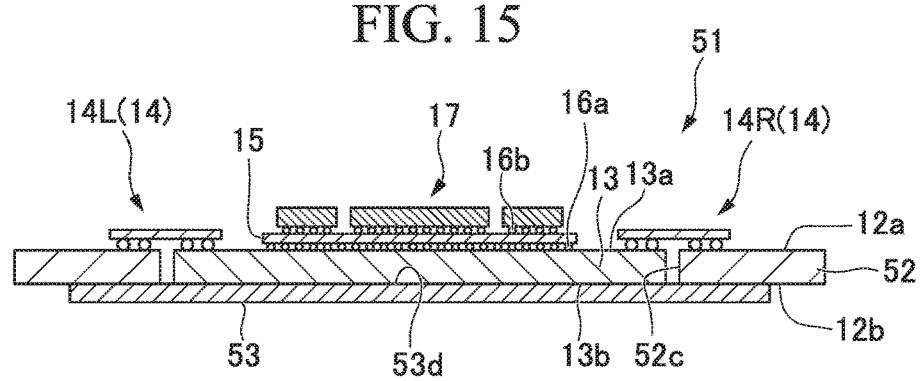
FIG. 15 is a schematic cross-sectional view showing an example of the electronic component of the sixth exemplary embodiment of the present invention.

FIG. 15 is a schematic cross-sectional view showing an example of the electronic component of the sixth exemplary embodiment of the present invention.

As shown in FIG. 15, the electronic component 51 of the present exemplary embodiment includes a first substrate 52 in place of the first substrate 12 of the electronic component 11 of the second exemplary embodiment. The electronic component 51 further includes a support plate 53.

The description that follows will focus on the points of difference with the second exemplary embodiment given above.

The first substrate 52 includes an opening portion 52c that penetrates the substrate in the direction of the substrate thickness, in place of the opening portion 12c of the first substrate 12 in the second exemplary embodiment. The shape in plan view of the opening portion 52c is the same as that of the opening portion 12c. The thickness of the first substrate 52 is equivalent to the thickness of the second substrate 13.

The same material used for the first substrate 12 may be used as the material of the first substrate 52.

The support plate 53 is a plate of a size that can cover the opening portion 52c. The support plate 53 is arranged on the substrate surface 12b of the first substrate 52 near the opening portion 52c so as to block the opening portion 52c. The support plate 53 is fixed to the substrate surface 12b by a suitable fixing method. As for the fixing method of the support plate 53, for example adhesion, soldering, screw fastening and the like may be used.

The support plate 53 is disposed opposing the second substrate 13, and is provided so as to be able to support the second substrate 13 from the substrate surface 12b side in the thickness direction of the first substrate 52. The support plate 53 is disposed opposing the second substrate 13, and may also be called a support member that is provided so as to be able to support the second substrate from the substrate surface on the opposite side of the first substrate surface in the thickness direction of the first substrate.

The shape of the support plate 53 is not particularly limited, provided the shape is one that can restrict movement of the second substrate portion 13 such that the second substrate 13 does not slip out from the opening portion 52c toward the substrate surface 12b.

The material of the support plate 53 is not particularly limited. The thermal expansion coefficient of the material of the support plate 53 may be the same as the thermal expansion coefficient of the first substrate 52, and may also differ. When the thermal expansion coefficient of the material of the support plate 53 differs from the thermal expansion coefficient of the first substrate 52, it is more preferred to be fixed with the first substrate 52 so that the thermal expansion of the support plate 53 may not be constrained. For example, the support plate 53 may be fixed in a freely movable manner with respect to the first substrate 52 along the substrate surface 12b.

When an electrically conductive pattern is not exposed on the substrate surface 13b of the first substrate 52, a metallic material may be used as the material of the support substrate 53. In this case, the support substrate 53 is capable of promoting heat dissipation from the first substrate 52 and the second substrate 13 by thermal conduction from the contact portion with the first substrate 52 and the contact portion with the second substrate 13.

By fixing the support plate 53 to the first substrate 52 in the electronic component 51 with such a configuration, the surface 53d of the support plate 53 exposed to the opening portion 52c includes same function as the bottom surface portion 12d in the second exemplary embodiment. That is, the surface 53d can support the second substrate 13 inserted in the opening 52c from the direction of substrate surface 13b. In the present exemplary embodiment, the surface 53d supports the substrate surface 13a of the second substrate 13 to be coplanar with the substrate surface 12a of the first substrate 52. In the case of warpage in the second substrate 13 that causes the substrate surface 13a to become convex, the surface 53d supports the peripheral edge portion of the second substrate 13 to be approximately coplanar with the substrate surface 12a of the first substrate 52.

For this reason, after fixing the support plate 53 to the first substrate 52, the electronic component 51 is manufactured by performing the same electronic component manufacturing method as the second exemplary embodiment.

However, the support plate 53 may be fixed with the first substrate 52 after connection between the second substrate 13 and the first substrate 52 is completed. For example, in the state of the opening portion 52c being covered by a manufacturing jig in place of the support plate 53, if the first substrate 52 and the second substrate 13 are mutually fixed by the connecting member 14, it is possible to connect the second substrate 13 and the first substrate 52 without fixing the support plate 53.

The electronic component 51 of the present exemplary embodiment differs on the point of the assembly of the first substrate 52 and the support plate 53 being used in place of the first substrate 12 of the second exemplary embodiment. For this reason, in the same manner as the second exemplary embodiment, even if the electronic component 51 includes substrates having different thermal expansion coefficients, manufacturing is easy and reliability is favorable.

Moreover, according to the present exemplary embodiment, when it is only possible to form the opening portion 52c of the through hole similar to the thickness of the first substrate 52 and the thickness of the second substrate 13, it is possible to accommodate the second substrate 13 in the opening portion 52c.

Moreover, since the opening portion 52c is formed with the through hole, manufacture of the first substrate 52 is easy compared to the case of constituting the opening portion 12c as a bottomed hole as in the second exemplary embodiment.

First Exemplary Modification

The electronic component of an exemplary modification (first exemplary modification) of the sixth exemplary embodiment of the present invention will be described.

Figure 16:
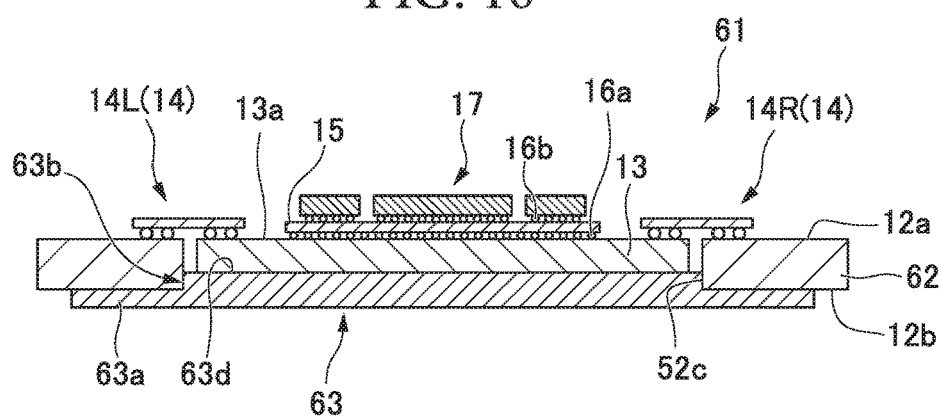
FIG. 16 is a schematic cross-sectional view showing an example of the electronic component of an exemplary modification (first exemplary modification) of the sixth exemplary embodiment of the present invention.

FIG. 16 is a schematic cross-sectional view showing an example of the exemplary modification (first exemplary modification) of the sixth exemplary embodiment of the present invention.

As shown in FIG. 16, an electronic component 61 of the present exemplary modification includes a first substrate 62 and a support plate 63 in place of the first substrate 52 and the support plate 53 of the electronic component 51 of the sixth exemplary embodiment.

Hereinbelow, the points of difference with the sixth exemplary embodiment will be described.

The first substrate 62 differs from the first substrate 52 in the sixth exemplary embodiment on the point of the substrate thickness being thicker than the second substrate 13.

The support substrate 63 is a plate-shaped member having a plate portion 63a and a protruding portion 63b.

The plate portion 63a has a size capable of blocking the opening portion 52c, similarly to the support plate 53 of the sixth exemplary embodiment.

The protruding portion 63b has a shape in plan view that can be inserted in the opening portion 52c. As for the size in plan view of the protruding portion 63b, a suitable size smaller than the opening portion 52c is possible. For example, the protruding portion 63b may be constituted by a plurality of projections such as columns, ribs or hemispheres being arranged at a suitable interval. For example, the protruding portion 63b may also be constituted by a single projection having a suitable shape in plan view.

In the example shown in FIG. 16, the protruding portion 63b is formed in a flatbed shape having a size and shape that fits the inside of the opening portion 52c. That is, a flat surface portion 63d that is parallel with the plate portion 63a is formed at the distal end in the protruding direction of the protruding portion 63b.

The protruding height of the protruding portion 63b from the flat surface portion 63a is a dimension obtained by subtracting the thickness of the second substrate 13 from the thickness of the first substrate 62.

The material of the support plate 63 may be the same material as the support plate 53.

The support plate 63 is disposed opposing the second substrate, and may also be called a support member that is provided so as to be able to support the second substrate from the substrate surface on the opposite side of the first substrate surface in the thickness direction of the first substrate.

The flat surface portion 63d of the flat support plate 63 is positioned within the opening portion 52c. For this reason, the support plate 63 is able to support the second substrate 13 in the interior of the opening portion 52c.

The support plate 63 is disposed so that the protruding portion 63b is inserted in the opening portion 52c from the substrate surface 12b side, and the plate portion 63a abuts the substrate surface 12b in the vicinity of the opening portion 52c. The support plate 63 is fixed to the substrate surface 12b similarly to the support plate 53 in the sixth exemplary embodiment. With such a configuration, the opening on the substrate surface 13b side of the opening portion 52c is blocked by the flat surface portion 63b of the support plate 63.

The electronic component 61 with such a configuration is manufactured similarly to the electronic component 51 of the sixth exemplary embodiment.

The electronic component 61 differs on the point of a space that accommodates the second substrate 13 being formed in combination with the first substrate 62 and the support plate 63. However, the substrate surface 13b of the second substrate 13 inserted in the opening portion 52c is supported from below in the figure by the flat surface portion 63d. Thereby, the substrate surface 13a is supported to be approximately coplanar (including being coplanar) with the substrate 12a at least the peripheral edge portion, similarly to the sixth exemplary embodiment.

For this reason, the electronic component 61 is manufactured similarly to the electronic component 51 of the sixth exemplary embodiment. Moreover, the electronic substrate 61 includes the same operation as the electronic component 51 of the sixth exemplary embodiment.

According to the electronic component 61 of the present exemplary modification, in the same manner as the sixth exemplary embodiment, even if the electronic component 61 includes substrates having different thermal expansion coefficients, manufacture is easy and reliability is favorable.

Moreover, according to the present exemplary modification, even when the thickness of the first substrate 62 is greater than the second substrate 13, positioning the substrate surface 13a at the peripheral edge portion of the second substrate 13 to be approximately coplanar with the substrate surface 12a is easy.

In addition, similarly to the sixth exemplary embodiment, since the opening portion 52c is formed by a through hole, compared to the case of constituting the through hole portion 12c with a bottomed hole portion as in the second exemplary embodiment, it is easy to manufacture the first substrate 62.

Second Exemplary Modification

The electronic component of an exemplary modification (second exemplary modification) of the sixth exemplary embodiment of the present invention will be described.

Figure 17:
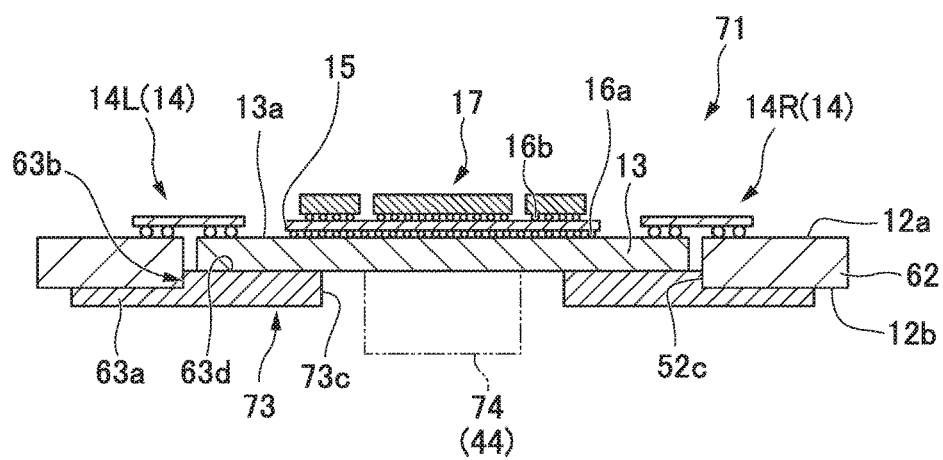
FIG. 17 is a schematic cross-sectional view showing an example of the electronic component of an exemplary modification (second exemplary modification) of the sixth exemplary embodiment of the present invention.

FIG. 17 is a schematic cross-sectional view showing an example of the exemplary modification (first exemplary modification) of the sixth exemplary embodiment of the present invention.

As shown in FIG. 17, the electronic component 71 of the present exemplary modification includes a support plate 73 in place of the support plate 63 of the electronic component 61 of the first exemplary modification.

The support plate 73 differs from the support plate 63 on the point of a through hole 73c that penetrates in the thickness direction being formed in the protruding portion 63b of the support plate 63 of the first exemplary modification.

The shape and size of the through hole 73c are not particular limited, provided the flat surface portion 63d capable of supporting the second substrate 13 from below in the figure remains. In the example shown in FIG. 17, the through hole 73c is formed at a location opposing the region where the silicon interposer substrate 15 is connected in plan view.

The support plate 73 is disposed opposing the second substrate, and may also be called a support member that is provided so as to be able to support the second substrate from the substrate surface on the opposite side of the first substrate surface in the thickness direction of the first substrate. The support plate 73 is an example of a support member having a through hole that penetrates in the thickness direction of the plate.

The electronic component 71 of this constitution is manufactured similarly to the electronic component 61 of the first exemplary modification.

In particular, by the through hole 73c being formed in the support plate 73, ventilation to the substrate surface 13b is simplified. Cooling of the second substrate 13 is promoted by outside air flowing to the substrate surface 13b through the through hole 73c.

The through hole 73c is used as an opening that allows a projection to pass through from the substrate surface 13a.

For example, as schematically shown in FIG. 17, when a heat sink 74 (refer to the double-dot chain line in the figure) is to be arranged on the substrate surface 13a, the through hole 73c may be used as an opening that allows insertion of the heat sink 74. When the heat sink 74 is mounted on the second substrate 13, it is possible to promote the cooling of the second substrate 13 by heat dissipation from the heat sink 74.

Also, when for example the same power feed electrode portion 44 as the fifth exemplary embodiment is provided on the substrate surface 13a, the through hole 73c may be used as an opening that allows the power feed electrode portion 44 to pass through. When the power feed electrode portion 44 is provided on the second substrate 13, the electronic component 71 is equipped with the same operation as the fifth exemplary embodiment.

According to the electronic component 71 of the present exemplary modification, in the same manner as the first exemplary modification, even if the electronic component 71 includes substrates having different thermal expansion coefficients, manufacture is easy and reliability is favorable.

The second to sixth exemplary embodiments and the exemplary modifications are described with examples of the case in which the connecting member is electrically connected with the electrically conductive pattern. However, a connection portion for mechanically connecting with the connecting member may be provided in at least one of the first substrate and the peripheral edge portion of the second substrate. As such a connection portion, for example a solderable conductive portion (dummy electrode) that does not form a circuit may be used. For example, an adhesion region where adhesive contact is made to the connecting member using a non-conductive adhesive agent may be provided in at least one of the first substrate and the peripheral edge portion of the second substrate.

The second to sixth exemplary embodiments and the exemplary modifications were described with examples of the case in which an LSI device is connected to the second substrate via the silicon interposer substrate 15 serving as one example of an interposer substrate. However, another interposer substrate may be used in place of the silicon interposer substrate 15, similarly to the first exemplary embodiment. As another interposer substrate, for example an organic interposer substrate may be used.

The sixth exemplary embodiment and the exemplary modifications thereof are described with examples of the case in which the support member includes a plate-shaped member. However, the support member is not limited to a plate-shaped member provided the second substrate is capable of providing support from the opposite side of the first substrate side so that the second substrate is collected in the opening portion. For example, as the support member, bar-shaped, wire-shaped, net-shaped, or mesh-shaped members arranged so as to traverse the interior or exterior of the opening portion may be provided.

The second exemplary modification of the sixth exemplary embodiment is described with an example of the case in which a through hole is provided in the center portion of the support member. However, the position of the through hole of the support member is not limited to the center portion. Moreover, a plurality of through holes may also be provided in the support member.

The second to sixth exemplary embodiments and the exemplary modifications are described with examples of the case in which a connecting member is arranged on the first substrate and the peripheral edge portion of the second substrate, with fixing of the substrates being performed by the connecting member. However, fixing by the connecting member may also be performed by arranging the first substrate and the peripheral edge portion of the second substrate on the connecting member.

In the second to sixth exemplary embodiments and the exemplary modifications, when the electrically conductive joining member 14c is formed with the solder ball S, descriptions are given with examples of the case of unconnection of the solder ball S and the connecting member (for example, the flexible substrate 14a) excluding the solder ball S, and the case of the solder ball S being fixed in advance to the connecting member excluding the solder ball S. However, the solder ball S may also be fixed to at least one of the first electrode and the second electrode in advance.

The fifth exemplary embodiment is described with an example of the case of the third electrode being connected to a power supply line, but the third electrode is not limited to a power supply line.

For example, an electrode to be connected to a signal line requiring a coaxial cable connection may be included in the third electrode. In this case, the power feed electrode portion 44 is constituted including a coaxial connector.

For example, an electrode to be connected to a photoelectric transducer may be included in the third electrode. In this case, the power feed electrode portion 44 is constituted to include an optical connector.

While preferred exemplary embodiments of the invention have been described and illustrated above, it should be understood that these are exemplary of the invention and are not to be considered as limiting. Additions, omissions, substitutions, and other exemplary modifications can be made without departing from the spirit or scope of the present invention. Accordingly, the invention is not to be considered as being limited by the foregoing description, and is only limited by the scope of the appended claims.

What is claimed is:

1. An electronic component comprising:
   a first substrate that comprises a first substrate surface;
   a second substrate that is arranged on the first substrate and has a thermal expansion coefficient different from a thermal expansion coefficient of the first substrate;
   a connecting member that connects the first substrate and a peripheral edge portion of the second substrate; and
   a third substrate that is mounted on a surface of the second substrate except for the peripheral edge portion,
   wherein the third substrate has a surface on which an electronic device is mounted,
   wherein the third substrate, has a thermal expansion coefficient different from the thermal expansion coefficient of the second substrate,
   wherein the thermal expansion coefficient of the second substrate is between the thermal expansion coefficient of the third substrate and the thermal expansion coefficient of the first substrate, and
   wherein the second substrate is fixed to the first substrate by the connecting member.

2. The electronic component according to claim 1,
   wherein the first substrate surface of the first substrate comprises an opening portion, and
   at least a portion of the second substrate is accommodated in the opening portion.

3. The electronic component according to claim 2, further comprising:
   a support member that is arranged opposing the second substrate, the support member supporting the second substrate from a side of a second substrate surface of the first substrate in a thickness direction of the first substrate, the second substrate surface being on an opposite side of the first substrate surface.

4. The electronic component according to claim 2, wherein the first substrate surface is approximately coplanar with a substrate surface of the peripheral edge portion of the second substrate.

5. The electronic component according to claim 1, wherein the connecting member has lower rigidity than the first substrate and the second substrate and is capable of deforming in response to relative movement of the first substrate and the second substrate.

6. The electronic component according to claim 1,
   wherein the first substrate comprises a first electrode arranged on a region of the first substrate surface, the region not overlapping with the second substrate when seen in a thickness direction of the first substrate,
   the second substrate comprises a second electrode arranged on a substrate surface of the second substrate,
   the connecting member comprises an electrically conductive pattern, the connecting member opposing the first electrode and the second electrode, and the connecting member straddling the first substrate and the second substrate, and
   the electrically conductive pattern is joined electrically with the first electrode and the second electrode by a joining member.

7. The electronic component according to claim 6, wherein a data signal is transmitted to a circuit formed by the electrically conductive pattern of the connecting member, the first electrode, and the second electrode.

8. The electronic component according to claim 1, wherein the second substrate comprises a third electrode that is not joined with the connecting member, and a power supply line is connected to the third electrode.

9. The electronic component according to claim 1,
   wherein the connecting member comprises a plurality of the connecting members, and
   wherein the first substrate and the second substrate are mutually connected by the plurality of the connecting members.

10. The electronic component according to claim 9, wherein the plurality of the connecting members are symmetrically arranged centered on the second substrate.

11. An electronic component manufacturing method comprising:

mounting a third substrate on a region of a surface of a second substrate except for a peripheral edge portion of the second substrate, the third substrate having a surface on which an electronic device is mounted, and the third substrate having a thermal expansion coefficient different from a thermal expansion coefficient of the second substrate;

arranging the second substrate on a first substrate, the first substrate having a thermal expansion coefficient different from the thermal expansion coefficient of the second substrate;

arranging a connecting member in a state of straddling the first substrate and the peripheral edge portion of the second substrate; and fixing the first substrate and the peripheral edge portion of the second substrate by the connecting member, wherein the thermal expansion coefficient of the second substrate is between the thermal expansion coefficient of the third substrate and the thermal expansion coefficient of the first substrate.

12. The electronic component according to claim 1, wherein a thermal expansion coefficient of the connection member is between the thermal expansion coefficient of the first substrate and the thermal expansion coefficient of the second substrate, wherein the thermal expansion coefficient of the connection member has a value closer to an average value than either the thermal expansion coefficient of the first substrate or the thermal expansion coefficient of the second substrate, and wherein the average value is an average value of the thermal expansion coefficient of the first substrate and the thermal expansion coefficient of the second substrate.

* * * * *